United States Patent
Han et al.

(10) Patent No.: US 11,501,948 B2
(45) Date of Patent: Nov. 15, 2022

(54) OPERATING A PARTICLE BEAM DEVICE

(71) Applicant: Carl Zeiss Microscopy GmbH, Jena (DE)

(72) Inventors: Luyang Han, Heidenheim (DE); Martin Edelmann, Aalen (DE); Josef Biberger, Wildenberg (DE)

(73) Assignee: Carl Zeiss Microscopy GmbH, Jena (DE)

( * ) Notice: Subject to any disclaimer, the term of this patent is extended or adjusted under 35 U.S.C. 154(b) by 199 days.

(21) Appl. No.: 16/893,605

(22) Filed: Jun. 5, 2020

(65) Prior Publication Data

US 2020/0395190 A1    Dec. 17, 2020

(30) Foreign Application Priority Data

Jun. 13, 2019 (DE) .............................. 102019208661

(51) Int. Cl.
*H01J 37/22*    (2006.01)
*H01J 37/26*    (2006.01)
(Continued)

(52) U.S. Cl.
CPC .............. *H01J 37/222* (2013.01); *G01N 3/06* (2013.01); *G06T 7/11* (2017.01); *G06T 7/97* (2017.01);
(Continued)

(58) Field of Classification Search
CPC ........ H01J 37/222; H01J 37/244; H01J 37/26; H01J 37/28; H01J 2237/2001;
(Continued)

(56) References Cited

U.S. PATENT DOCUMENTS

| 2004/0036031 A1 | 2/2004 | Rose et al. |
| 2013/0105706 A1 | 5/2013 | Han et al. |
| 2021/0112203 A1* | 4/2021 | Walden, II .............. G06T 7/337 |

FOREIGN PATENT DOCUMENTS

WO    WO 2002/067286 A2    8/2002

OTHER PUBLICATIONS

Wikipedia, "Digital image correlation and tracking," Jul. 19, 2020.
(Continued)

*Primary Examiner* — Kiet T Nguyen
(74) *Attorney, Agent, or Firm* — Muirhead and Saturnelli, LLC

(57) ABSTRACT

A method of operating a particle beam device for imaging, analyzing and/or processing an object may be carried out, for example, by a particle beam device. The method may include: identifying at least one region of interest on the object; defining: (i) an analyzing sequence for analyzing the object, (ii) a processing sequence for processing the object by deformation and (iii) an adapting sequence for adapting the at least one region of interest depending on the processing sequence and/or on the analyzing sequence; processing the object by deformation according to the processing sequence and/or analyzing the object according to the analyzing sequence; adapting the at least one region of interest according to the adapting sequence; and after or while adapting the at least one region of interest, imaging and/or analyzing the at least one region of interest using a primary particle beam being generated by a particle beam generator.

20 Claims, 15 Drawing Sheets

(51) Int. Cl.
*H01J 37/244* (2006.01)
*G01N 3/06* (2006.01)
*G06T 7/11* (2017.01)
*G06T 7/00* (2017.01)

(52) U.S. Cl.
CPC ............ *H01J 37/244* (2013.01); *H01J 37/26* (2013.01); *G06T 2207/10061* (2013.01); *G06T 2207/20092* (2013.01); *H01J 2237/2001* (2013.01); *H01J 2237/221* (2013.01); *H01J 2237/2487* (2013.01); *H01J 2237/25* (2013.01); *H01J 2237/30* (2013.01); *H01J 2237/30411* (2013.01)

(58) Field of Classification Search
CPC ....... H01J 2237/2062; H01J 2237/2065; H01J 2237/24585; H01J 2237/2813; H01J 2237/2803; H01J 2237/221; H01J 2237/2487; H01J 2237/25; H01J 2237/30; H01J 2237/30411; G01N 3/06; G01N 3/08; G01N 3/20; G01N 3/24; G01N 2203/0641; G06T 7/11; G06T 7/97; G06T 2207/10061; G06T 2207/20092; G01Q 30/02
USPC .................................................. 250/307, 306
See application file for complete search history.

(56) References Cited

OTHER PUBLICATIONS

A. Couret, et al., "In situ deformation in TEM: recent developments," Microscopy Microanalysis Microstructures 4.2-3, Apr./Jun. 1993, pp. 153-170.

J. Deneen, et al., "In situ deformation of silicon nanospheres," Journal of Materials Science 41.14 (2006), pp. 4477-4483.

* cited by examiner

OPERATING A PARTICLE BEAM DEVICE

TECHNICAL FIELD

The system described herein relates to a method for operating a particle beam device for imaging, analyzing and/or processing an object. Moreover, the system described herein relates to a particle beam device for carrying out the method. For example, the particle beam device may be an electron beam device and/or or an ion beam device.

BACKGROUND OF THE INVENTION

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated using a beam generator and focused on an object to be examined using a beam guiding system. An objective lens is used for focusing purposes. The primary electron beam is guided over a surface of the object to be examined by means of a deflection device. This is also referred to as scanning. The area scanned by the primary electron beam is also referred to as scanning region. The electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence. At least one radiation detector is used to detect the interaction radiation. Additionally or alternatively, electrons of the primary electron beam are used to ablate or modify the object.

In the case of a TEM, a primary electron beam is likewise generated using a beam generator and directed onto an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally may comprise a projection lens. Imaging may also take place in the scanning mode of a TEM. Such a TEM is often referred to as STEM. Additionally, provision may be made for detecting, by means of at least one further detector, electrons scattered back at the object to be examined and/or secondary electrons emitted by the object to be examined in order to image the object to be examined. Additionally or alternatively, in a TEM or STEM, electrons of the primary electron beam are used to ablate or modify the object.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated or material is applied onto the object during the processing. The ions are additionally or alternatively used for imaging.

Furthermore, the prior art has disclosed the practice of analyzing and/or processing an object in a particle beam device using, on one hand, electrons and, on the other hand, ions. By way of example, an electron beam column having the function of an SEM is arranged at the particle beam device. Additionally, an ion beam column, as explained above, is arranged at the particle beam device. The electron beam column with the SEM function serves, in particular, for examining further the processed or unprocessed object, but also for processing the object.

It is known to set up in-situ experiments in an object chamber of a particle beam device, in particular an SEM. An object is processed in a specific way determined by an operator of the particle beam device and is imaged and/or analyzed using the particle beam device. When carrying out such an in-situ experiment, the operator often needs to control multiple devices of the experiment as such, on one hand, and of the particle beam device, on the other hand. Moreover, the operator often needs to coordinate and correlate the different devices of the experiment as such, on one hand, and of the particle beam device, on the other hand. The control and the correct correlation are often rather complicated. One example of such an in-situ experiment is a deformation experiment which is described further below.

It is known to carry out a deformation experiment using an SEM for imaging and/or analyzing an object being arranged in an object chamber of the SEM. The object is arranged on a sub-stage, and the sub-stage is arranged on a movable object stage of the SEM. For example, the movable object stage may be moved in an x-direction, in a y-direction and in a z-direction being perpendicular to each other. Additionally, the movable object stage may be rotated about a first stage axis of rotation and about a second stage axis of rotation arranged perpendicular to the first stage axis of rotation. The deformation experiment is usually carried out for learning about material conditions of the object which may have changed after having applied forces to the object. For applying forces to the object, the substage may comprise a mechanical force application module and/or a temperature module for heating or cooling the object. Using the mechanical force application module, a tensile force, a compressive force, a shearing force, a bending force and/or a torsion force may be applied to the object. After having applied at least one of the aforementioned forces to the object and/or after heating or cooling the object, imaging and/or analyzing of the object is carried out by using, for example, energy dispersive X-ray spectroscopy (also known as EDS or EDX). When the primary electron beam impinges on the object, the electrons of the primary electron beam interact with the object to be examined. As mentioned above, interaction radiation in the form of X-ray radiation results as a consequence of the interaction. At least one radiation detector in the form of an EDX detector is used to detect the interaction radiation. Additionally or alternatively, after having applied at least one of the aforementioned forces to the object and/or after heating or cooling the object, imaging and/or analyzing of the object is carried out by using, for example, electron backscattering diffraction (also known as EBSD). Using EBSD, the distribution of electrons backscattered at the object after incidence of the primary electron beam on the object is determined. The backscattered electrons are detected by an EBSD detector. The distribution of the backscattered electrons is determined in order to draw conclusions concerning the crystal structure of the object.

The operator of the particle beam device often needs to visually observe the force response of the material of the object when applying the force to the object, on one hand, and/or to visually observe an image provided by the SEM to find the right moment for imaging and/or analyzing the object, on the other hand. In particular, the operator of the SEM usually stops applying the force to the object when imaging and/or analyzing the object by means of the primary particle beam is carried out. Therefore, the operator often has to manually control the deformation experiment, in particular by stopping the application of the force to the object and/or by controlling the correct adjustment of the particle beam device for imaging and/or analyzing the object.

It is therefore desirable to provide a method and a particle beam device for carrying out the method, by means of which an in-situ experiment may be carried out in a particle beam device, wherein the in-situ experiment does not have to be permanently controlled by an operator.

SUMMARY OF THE INVENTION

Described herein is a system for imaging, analyzing and/or processing an object. A method according to the system described herein may be used for operating a particle beam device for imaging, analyzing and/or processing an object. The aforementioned particle beam device may be an electron beam device and/or an ion beam device. The particle beam device may comprise a particle beam generator generating charged particles. The charged particles may be electrons and/or ions.

An embodiment of the method according to the system described herein comprises the step of identifying at least one region of interest on the object. As explained further below, the region of interest may be identified using several devices.

Moreover, an embodiment of the method according to the system described herein comprises defining: (i) an analyzing sequence for analyzing the object, (ii) a processing sequence for processing the object by deformation and (iii) an adapting sequence for adapting the region of interest depending on the processing sequence (that is according to the processing sequence) and/or depending on the analyzing sequence (that is according to the analyzing sequence). Deformation is any process of deforming the object by applying, for example, a force or a temperature to the object. Embodiments of the analyzing sequence, the processing sequence and the adapting sequence are explained further below.

The analyzing sequence for analyzing the object may comprise at least one step for analyzing the object. For example, interaction particles and/or interaction radiation may be detected using at least one detector.

The processing sequence for processing the object may comprise at least one step for processing the object by deformation. In particular, the processing sequence may comprise information about whether a force is applied to the object and/or an indication of the time when the force is applied to the object. In particular, a tensile force, a compressive force, a shearing force, a bending force and/or a torsion force may be applied to the object. Moreover, the processing sequence may comprise information about whether a specific temperature is applied to the object and/or an indication of the time when the specific temperature is applied to the object.

For example, when processing the object, in particular by applying a force to the object and when processing the object by deformation, an initial position of the region of interest on the object may change. Without an active adaption of the position of the region of interest, a feature which an operator is interested in may drift outside of the initial region of interest. Therefore, the region of interest should be adapted. The adapting sequence is used for adapting that region of interest depending on the processing sequence (that is according to the processing sequence) and/or depending on the analyzing sequence (that is according to the analyzing sequence), wherein at least one step for adapting the region of interest is used. Adapting the region of interest used in the method according the system described herein may comprise any adapting of the region of interest which is suitable for the system described herein. For example, adapting the region of interest may comprise a shift of an identified position of the region of interest to a new position. This might be useful if the identified position of the region of interest has been drifted due to, for example, a stretching and/or a compression of the object. Additionally or alternatively, adapting the region of interest may comprise identifying at least one new region of interest used for an embodiment of the method according to the system described herein and/or to delete the former identified region of interest such that it is not used anymore for the method. This embodiment may be useful if there is no real effect to the object at the identified region of interest when processing the object. In such a case, the new region of interest is identified where an effect to the object is more likely to be expected. Additionally or alternatively, adapting the region of interest may comprise changing the size and/or the shape of the region of interest. This might be useful, for example, for imaging the region of interest with an higher resolution than the resolution used before and/or to reduce analyzing time when analyzing the object. Further different ways of adapting the region of interest are explained further below.

Moreover, an embodiment of the method according to the system described herein comprises the step of processing the object according to the processing sequence by deformation. In particular, a force may be applied to the object at a specific time. For example, a tensile force, a compressive force, a shearing force, a bending force and/or a torsion force may be applied to the object. Moreover, a specific temperature may be applied to the object at a specific time.

The method according to the system described herein also may comprise the step of analyzing the object according to the analyzing sequence. For example, interaction particles and/or interaction radiation are detected using at least one detector.

Additionally, an embodiment of the method according to the system described herein comprises the step of adapting the region of interest according to the adapting sequence. Several embodiments of adapting the region of interest are mentioned above or further below. After or while adapting the region of interest, an embodiment of the method according to the system described herein provides for imaging and/or analyzing the region of interest using the primary particle beam being generated by the particle beam generator of the particle beam device.

The method according to the system described herein has the advantage that an in-situ experiment, namely an experiment carried out in the object chamber of the particle beam device, does not have to be permanently controlled by an operator of the particle beam device. By defining the analyzing sequence for analyzing the object and/or by defining the processing sequence for processing the object by deformation and/or by defining the adapting sequence for adapting the region of interest depending on the processing sequence (that is according to the processing sequence) and/or depending on the analyzing sequence (that is according to the analyzing sequence), an embodiment of the method according to the system described herein may automatically be carried out without permanent control by the operator. Moreover, an embodiment of the method according to the system described herein provides for an optimized workflow for an in-situ experiment carried out in the particle beam device, which workflow may be used for any in-situ experiment. The method according to the system described herein may be applied to a deformation experiment.

It is additionally or alternatively provided in an embodiment of the method according to the system described herein that the method further comprises at least one of the following: (i) using the primary particle beam and/or a further particle beam for identifying the region of interest, (ii) using an optical microscope for identifying the region of interest and (iii) using a camera for identifying the region of interest. Additionally or alternatively, the region of interest is identified as a polygon comprising edges, wherein the region of interest is surrounded and enclosed by the edges. At least two of the edges may be connected to each other at an edge node. It is additionally or alternatively provided in an embodiment of the method according to the system described herein that the region of interest is subdivided into at least two sub regions of interest. This is in particular advantageous if an image of the object is generated using a smaller pixel size for imaging the sub regions of interest in comparison to the pixel size used for imaging the complete region of interest.

As mentioned above, the processing sequence for processing the object by deformation may comprise at least one step for processing the object. In particular, the processing sequence may comprise information about whether a force is applied to the object and/or an indication of the time when the force is applied to the object. In particular, a tensile force, a compressive force, a shearing force, a bending force and/or a torsion force may be applied to the object. Moreover, the processing sequence may comprise information about whether a specific temperature is applied to the object and/or an indication of the time when the specific temperature is applied to the object. It is additionally or alternatively provided in an embodiment of the method according to the system described herein that defining the processing sequence comprises at least one of: (i) applying a first tensile force to the object at a first tensile time and applying a second tensile force to the object at a second tensile time, (ii) applying a first compressive force to the object at a first compressive time and applying a second compressive force to the object at a second compressive time, (iii) applying a first shearing force to the object at a first shearing time and applying a second shearing force to the object at a second shearing time, (iv) applying a first bending force to the object at a first bending time and applying a second bending force to the object at a second bending time, (v) applying a first torsion force to the object at a first torsion time and applying a second torsion force to the object at a second torsion time, and (vi) applying a first temperature to the object at a first temperature time and applying a second temperature to the object at a second temperature time.

It is additionally or alternatively provided in an embodiment of the method according to the system described herein that the region of interest is imaged and/or analyzed at the first tensile time and/or at the second tensile time. Alternatively, applying the first tensile force is stopped before imaging and/or analyzing the region of interest. After imaging and/or analyzing the region of interest, the second tensile force may be applied to the object at the second tensile time.

It is additionally or alternatively provided in an embodiment of the method according to the system described herein that the region of interest is imaged and/or analyzed at the first compressive time and/or at the second compressive time. Alternatively, applying the first compressive force is stopped before imaging and/or analyzing the region of interest. After imaging and/or analyzing the region of interest, the second compressive force may be applied to the object at the second compressive time.

It is additionally or alternatively provided in an embodiment of the method according to the system described herein that the region of interest is imaged and/or analyzed at the first shearing time and/or at the second shearing time. Alternatively, applying the first shearing force is stopped before imaging and/or analyzing the region of interest. After imaging and/or analyzing the region of interest, the second shearing force may be applied to the object at the second shearing time.

It is additionally or alternatively provided in an embodiment of the method according to the system described herein that the region of interest is imaged and/or analyzed at the first bending time and/or at the second bending time. Alternatively, applying the first bending force is stopped before imaging and/or analyzing the region of interest. After imaging and/or analyzing the region of interest, the second bending force is applied to the object at the second bending time.

It is additionally or alternatively provided in an embodiment of the method according to the system described herein that the region of interest is imaged and/or analyzed at the first torsion time and/or at the second torsion time. Alternatively, applying the first torsion force is stopped before imaging and/or analyzing the region of interest. After imaging and/or analyzing the region of interest, the second torsion force is applied to the object at the second torsion time.

It is additionally or alternatively provided in an embodiment of the method according to the system described herein that the region of interest is imaged and/or analyzed at the first temperature time and/or at the second temperature time. Alternatively, applying the first temperature is stopped before imaging and/or analyzing the region of interest. After imaging and/or analyzing the region of interest, the second temperature is applied to the object at the second temperature time.

It is additionally or alternatively provided in an embodiment of the method according to the system described herein that the region of interest is imaged and/or analyzed until an elastic limit of the object is reached. The elastic limit is the limit at which the material of the object begins to deform plastically. In other words, at the elastic limit and beyond, permanent deformation of the material of the object occurs. It is additionally or alternatively provided in an embodiment of the method according to the system described herein that the region of interest is imaged and/or analyzed when the elastic limit of the object is reached. It is provided additionally or alternatively in a further embodiment of the method according to the system described herein that the region of interest is imaged and/or analyzed when the elastic limit of the object is exceeded.

It is additionally or alternatively provided in an embodiment of the method according to the system described herein that the region of interest is imaged and/or analyzed until a tensile strength limit of the object is reached. The tensile strength limit is the maximum force that the material of the object can withstand without breaking while being stretched or pulled. It is additionally or alternatively provided in an embodiment of the method according to the system described herein that the region of interest is imaged and/or analyzed when the tensile strength limit of the object is reached.

As mentioned above, when analyzing and/or processing the object, in particular by applying a force to the object and in particular when processing the object by deformation, the initial position of the region of interest on the object may change. Without an active adaption of the position of the region of interest, a feature which an operator is interested in may drift outside of the initial region of interest. Therefore, the region of interest should be adapted. It is additionally or alternatively provided in an embodiment of the method according to the system described herein that the adapting sequence comprises at least one of the following:
  using a cross correlation for adapting the region of interest, wherein while performing the cross correlation, (a) before a step of the analyzing sequence and/or of the processing sequence is carried out, a first image of the region of interest is obtained first, (b) after the step of the analyzing sequence and/or of the processing sequence has been carried out, a second image of the region of interest is obtained second, (c) a shift between the first image and the second image of the region of interest is calculated using a calculation unit, and wherein (d) the shift is used for adapting the region of interest;
  using a digital image correlation for adapting the region of interest, wherein while performing the digital image correlation, (a) before a step of the analyzing sequence and/or of the processing sequence is carried out, a reference image of an area of the object is obtained, wherein the area of the object includes the region of interest, (b) after the step of the analyzing sequence and/or of the processing sequence has been carried out, a processing image of the area of the object is obtained, wherein the area of the object includes the region of interest, (c) a displacement vector is obtained for at least some of the pixels or for each pixel of the processing image by comparing the reference image with the processing image, and (d) the displacement vector is used for adapting the region of interest.

It is additionally or alternatively provided in an embodiment of the method according to the system described herein that the method further comprises providing a stop signal and after the stop signal has been provided, stopping at least one of: analyzing the object, processing the object, adapting the region of interest, imaging the region of interest and analyzing the region of interest.

It is additionally or alternatively provided in an embodiment of the method according to the system described herein that the stop signal is provided by a user of the particle beam device. In particular, the stop signal is provided by an operator of the particle beam device. Additionally or alternatively, the stop signal is provided if an end of the processing sequence has been reached. This is the case, for example, when the total time of deformation has run out or when a threshold of the force applied to the object has been reached. Additionally or alternatively, the stop signal is provided if a specific condition of the object has been reached during the, for example automatic, processing. For example, the specific condition may be given by the elastic limit or the tensile strength limit which has been reached or is exceeded.

It is additionally or alternatively provided in an embodiment of the method according to the system described herein that the region of interest is a first region of interest, wherein the method further comprises identifying a second region of interest on the object and using the second region of interest for carrying out the method according to at least one of the above mentioned or further below mentioned steps or a combination of at least two of the above mentioned or further below mentioned steps.

It is additionally or alternatively provided in an embodiment of the method according to the system described herein that the method comprises at least one of the following:
  processing the object comprises automatically processing the object by deformation according to the processing sequence;
  analyzing the object comprises automatically analyzing the object according to the analyzing sequence;
  adapting the at least one region of interest comprises automatically adapting the at least one region of interest according to the adapting sequence;
  after or while adapting the at least one region of interest, imaging and/or analyzing the at least one region of interest comprises automatically imaging and/or automatically analyzing the at least one region of interest using the primary particle beam being generated by a particle beam generator of the particle beam device.

Embodiments of the system described herein include a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

Embodiments of the system described herein include a particle beam device for imaging, analyzing and/or processing an object. The particle beam device according to the system described herein may comprise at least one particle beam generator for generating a primary particle beam comprising charged particles. The charged particles may be, for example, electrons or ions. Moreover, the particle beam device according to the system described herein also may have at least one objective lens for focusing the primary particle beam onto the object. Furthermore, the particle beam device according to the system described herein may have at least one detector for detecting interaction particles and/or interaction radiation, the interaction particles and interaction radiation being generated when the primary particle beam impinges on the object. The interaction particles may be secondary particles and/or backscattered particles, in particular secondary electrons and backscattered electrons. The interaction radiation may be X-rays and/or cathodoluminescence light. Moreover, the particle beam device according to the system described herein may comprise at least one processing unit for processing the object by deformation. In particular, the processing unit is used for applying a force to the object. In particular, a tensile force, a compressive force, a shearing force, a bending force and/or a torsion force may be applied to the object. Furthermore, the particle beam device according to the system described herein may comprise at least one processor into which a computer program product as mentioned above is loaded.

An embodiment of the particle beam device according to the system described herein additionally or alternatively comprises the feature that the processing unit is a deformation unit. For example, the processing unit may comprise a mechanical force application module and/or a temperature module for heating or cooling the object.

A further embodiment of the particle beam device according to the system described herein additionally or alternatively comprises a movable object stage for arranging an object in the object chamber of the particle beam device. For example, the object stage may be moved in an x-direction, in a y-direction and in a z-direction being perpendicular to each other. Additionally, the object stage may be rotated about a first stage axis of rotation and about a second stage axis of rotation arranged perpendicular to the first stage axis of rotation.

It is additionally or alternatively provided in an embodiment of the particle beam device according to the system described herein that the particle beam generator is a first particle beam generator for generating a first primary particle beam comprising first charged particles. The objective lens is a first objective lens for focusing the first primary particle beam onto the object. The particle beam device according to this embodiment of the system described herein further may comprise a second particle beam generator for generating a second primary particle beam comprising second charged particles and a second objective lens for focusing the second primary particle beam onto the object. The second charged particles may be electrons and/or ions.

It is additionally or alternatively provided in a further embodiment of the particle beam device that the particle beam device is at least one of the following: an electron beam device and an ion beam device. In particular, the particle beam device may be both, an electron beam device and an ion beam device. The electron beam device and the ion beam device may be arranged at an angle to each other, for example an angle in the range of 45° to 90°, wherein the boundaries are included in this range. In particular, the electron beam device and the ion beam device may be arranged at an angle of 54° to each other. However, the system described herein is not restricted to the above-mentioned angles. Rather, any angle between the electron beam device and the ion beam device which is suitable for the system described herein may be used.

BRIEF DESCRIPTION OF THE DRAWINGS

Embodiments of the system described herein will be explained in more detail in the following text with reference to the figures, in which.

DESCRIPTION OF VARIOUS EMBODIMENTS

The system described herein is now explained in more detail by means of a particle beam device in the form of an SEM and in the form of a combination device, which may have an electron beam column and an ion beam column. Reference is explicitly made to the fact that the system described herein may be used in any particle beam device, in particular in any electron beam device and/or in any ion beam device.

Figure 1:
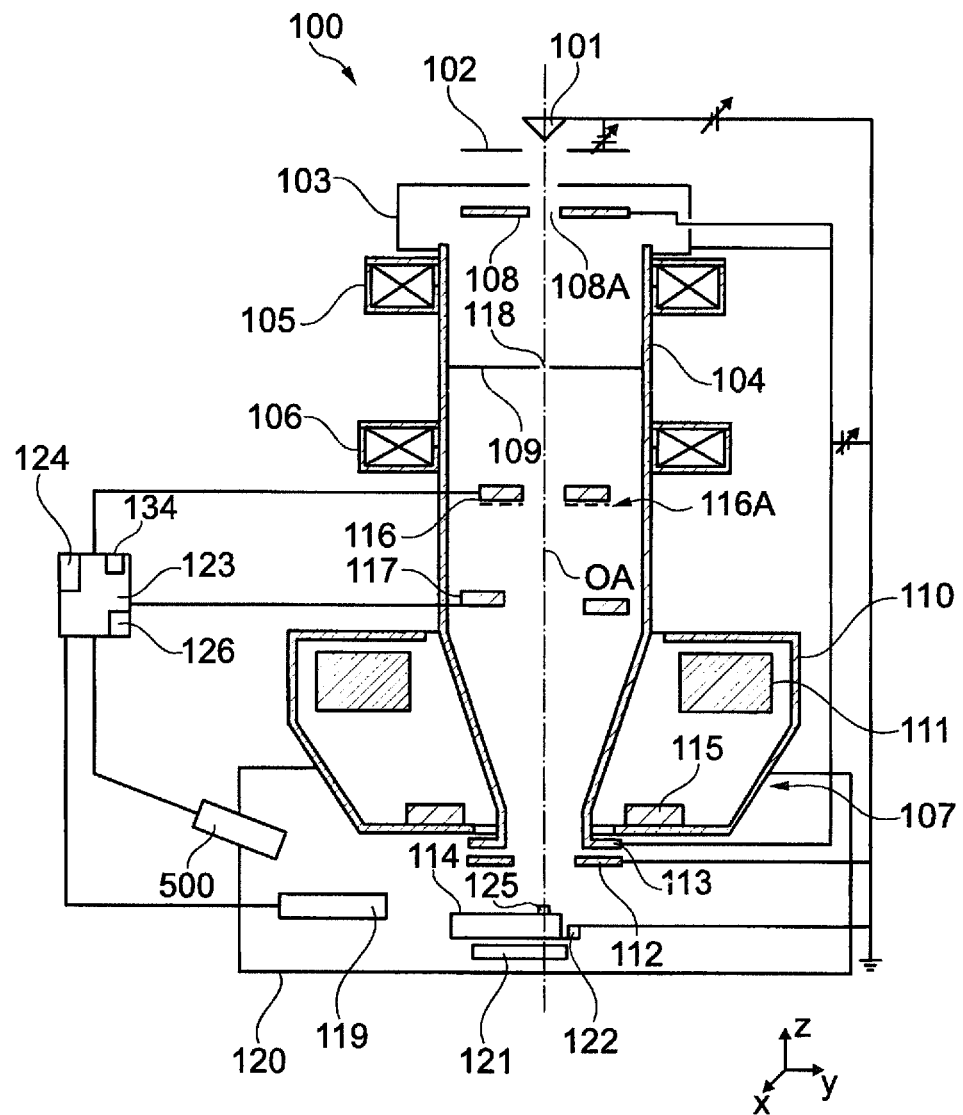
FIG. 1 shows a first illustrative embodiment of a particle beam device.

FIG. 1 shows a schematic illustration of an SEM 100. The SEM 100 may comprise a first beam generator in the form of an electron source 101, which is embodied as a cathode. Further, the SEM 100 may be provided with an extraction electrode 102 and with an anode 103, which is arranged on one end of a beam-guiding tube 104 of the SEM 100. By way of example, the electron source 101 is embodied as a thermal field emitter. However, the system described herein is not restricted to such an electron source 101. Rather, any electron source is utilizable.

Electrons emerging from the electron source 101 form a primary electron beam. The electrons may be accelerated to the anode potential due to a potential difference between the electron source 101 and the anode 103. In the illustrative embodiment depicted here, the anode potential is 1 kV to 20 kV, e.g., 5 kV to 15 kV, in particular 8 kV, in relation to a ground potential of a housing of an object chamber 120. However, alternatively it may be at ground potential.

Two condenser lenses, namely a first condenser lens 105 and a second condenser lens 106, may be arranged at the beam-guiding tube 104. Starting from the electron source 101 as viewed in the direction of a first objective lens 107, the first condenser lens 105 may be arranged first, followed by the second condenser lens 106. Reference is explicitly made to the fact that further illustrative embodiments of the SEM 100 may have only a single condenser lens. A first aperture unit 108 may be arranged between the anode 103 and the first condenser lens 105. Together with the anode 103 and the beam-guiding tube 104, the first aperture unit 108 may be at a high voltage potential, namely the potential of the anode 103, or it is connected to ground. The first aperture unit 108 may have numerous first apertures 108A, of which one is depicted in FIG. 1. For example, two first apertures 108A may be present. Each one of the numerous first apertures 108A may have a different aperture diameter. By means of an adjustment mechanism (not depicted here), it is possible to arrange a desired first aperture 108A onto an optical axis OA of the SEM 100. Reference is explicitly made to the fact that, in further illustrative embodiments, the first aperture unit 108 may be provided with only a single first aperture 108A. In such illustrative embodiment, an adjustment mechanism may be omitted. The first aperture unit 108 is then stationary. A stationary second aperture unit 109 may be arranged between the first condenser lens 105 and the second condenser lens 106. As an alternative thereto, the second aperture unit 109 is movable.

The first objective lens 107 may have pole pieces 110, in which a bore may be formed. The beam-guiding tube 104 may be guided through this bore. A coil 111 may be arranged in the pole pieces 110.

An electrostatic retardation device may be arranged in a lower region of the beam-guiding tube 104. It may have a single electrode 112 and a tube electrode 113. The tube electrode 113 may be arranged at one end of the beam-guiding tube 104, which faces an object 125 that may be arranged on a processing unit 114. The processing unit 114 is explained in more detail below.

Together with the beam-guiding tube 104, the tube electrode 113 may be at the potential of the anode 103, while the single electrode 112 and the object 125 may be at a lower potential than the anode 103. In the present case, this lower potential is the ground potential of the housing of the object chamber 120. In this manner, the electrons of the primary electron beam may be decelerated to a desired energy which is required for examining the object 125.

The SEM 100 further may comprise a scanning device 115, by means of which the primary electron beam may be deflected and scanned over the object 125. In so doing, the electrons of the primary electron beam interact with the object 125. As a result of the interaction, interaction particles may be generated, which may be detected. In particular, electrons may be emitted from the surface of the object 125—the so-called secondary electrons—or electrons of the primary electron beam may be scattered back—the so-called backscattered electrons—as interaction particles.

The object 125 and the single electrode 112 may also be at different potentials and potentials different from ground. It is thereby possible to set the location of the retardation of the primary electron beam in relation to the object 125. By way of example, if the retardation is carried out quite close to the object 125, imaging aberrations become smaller.

A detector arrangement comprising a first detector 116 and a second detector 117 may be arranged in the beam-guiding tube 104 for detecting the secondary electrons and/or the backscattered electrons. The first detector 116 may be arranged on the source-side along the optical axis OA, while the second detector 117 may be arranged on the object-side along the optical axis OA in the beam-guiding tube 104. The first detector 116 and the second detector 117 may be arranged offset from one another in the direction of the optical axis OA of the SEM 100. The first detector 116 and the second detector 117 each may have a passage opening, through which the primary electron beam may pass. The first detector 116 and the second detector 117 may be approximately at the potential of the anode 103 and of the beam-guiding tube 104. The optical axis OA of the SEM 100 extends through the respective passage openings.

The second detector 117 serves principally for detecting secondary electrons.

Upon emerging from the object 125, the secondary electrons initially may have low kinetic energy and arbitrary directions of motion. By means of the strong extraction field emanating from the tube electrode 113, the secondary electrons may be accelerated in the direction of the first objective lens 107. The secondary electrons enter the first objective lens 107 approximately parallel. Also, the beam diameter of the beam of secondary electrons remains small in the first objective lens 107. The first objective lens 107 then may have a strong effect on the secondary electrons and generates a comparatively short focus of the secondary electrons with sufficiently steep angles with respect to the optical axis OA, such that the secondary electrons diverge far apart from one another downstream of the focus and may be incident on the active area of the second detector 117. By contrast, only a small proportion of electrons that are backscattered at the object 125—that is to say, backscattered electrons which have relatively high kinetic energy in comparison with the secondary electrons upon emerging from the object 125—may be detected by the second detector 117. The high kinetic energy and the angles of the backscattered electrons with respect to the optical axis OA upon emerging from the object 125 may have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grating 116A. The opposing field grating 116A may be arranged at the side of the first detector 116 directed toward the object 125. With respect to the potential of the beam-guiding tube 104, the opposing field grating 116A may have a negative potential such that only backscattered electrons with high energy pass through the opposing field grating 116A to the first detector 116. Additionally or alternatively, the second detector 117 has a further opposing field grating, whose design and function are analogous to those of the aforementioned opposing field grating 116A of the first detector 116.

The detection signals generated by the first detector 116 and the second detector 117 may be used to generate an image or images of the surface of the object 125.

Reference is explicitly made to the fact that, for the sake of clarity, the apertures of the first aperture unit 108 and of the second aperture unit 109 as well as the passage openings of the first detector 116 and of the second detector 117 are depicted disproportionately large. Perpendicular to the optical axis OA, the passage openings of the first detector 116 and of the second detector 117 may have an extent in the range of 0.5 mm to 5 mm. By way of example, they are of circular design and have a diameter in the range of 1 mm to 3 mm perpendicular to the optical axis OA.

The second aperture unit 109 may be configured as a pinhole aperture in the illustrative embodiment depicted here and provided with a second aperture 118 for the passage of the primary electron beam, which may have an extent in the range from 5 μm to 500 μm, e.g., 35 μm. As an alternative thereto, provision is made in a further embodiment for the second aperture unit 109 to be provided with a plurality of apertures, which may be displaced mechanically with respect to the primary electron beam or which may be reached by the primary electron beam by the use of electrical and/or magnetic deflection elements. The second aperture unit 109 may be embodied as a pressure stage unit. It separates a first region, in which the electron source 101 may be arranged and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam-guiding tube 104, which leads to the object chamber 120.

The object chamber 120 may be under vacuum. For the purpose of generating the vacuum, a pump (not illustrated) may be arranged at the object chamber 120. In the illustrative embodiment illustrated in FIG. 1, the object chamber 120 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the object chamber 120 may be vacuum-sealed.

The processing unit 114 may be arranged at a movable object stage 122. The object stage 122 may be movable in three directions arranged perpendicular to each another, namely in an x-direction (first stage axis), in a y-direction (second stage axis) and in a z-direction (third stage axis). Moreover, the object stage 122 may be rotated about two rotational axes which may be arranged perpendicular to one another (stage rotation axes).

The SEM 100 further may comprise a third detector 121, which may be arranged in the object chamber 120. More precisely, the third detector 121 may be arranged downstream of the processing unit 114, as seen from the electron source 101 along the optical axis OA. The processing unit 114 may be rotated in such a way that the primary electron beam may radiate through the object 125 that may be arranged on the processing unit 114. When the primary electron beam passes through the object 125 to be examined, the electrons of the primary electron beam interact with the material of the object 125 to be examined. The electrons passing through the object 125 to be examined may be detected by the third detector 121.

Arranged at the object chamber 120 may be a radiation detector 500, which may be used to detect interaction radiation, for example X-ray radiation and/or cathodoluminescence. In particular, the radiation detector 500 may be used for EDX. Moreover, the SEM 100 may comprise an EBSD detector 119 which may be arranged in the object chamber 120.

The radiation detector 500, the first detector 116, the second detector 117 and the EBSD detector 119 may be connected to a monitoring unit 123, which may have a monitor 124. The third detector 121 also may be connected to the monitoring unit 123. For reasons of clarity, this is not illustrated. The monitoring unit 123 processes detection signals that may be generated by the first detector 116, the second detector 117, the EBSD detector 119, the third detector 121 and/or the radiation detector 500 and displays said detection signals, in particular in the form of images, on the monitor 124.

Furthermore, the SEM 100 may comprise a processor 126 into which a program code may be loaded for controlling the SEM 100 in such a way that a method according to the system described herein is carried out. Moreover, the monitoring unit 123 may comprise a database 134 for storing data.

Figure 2:
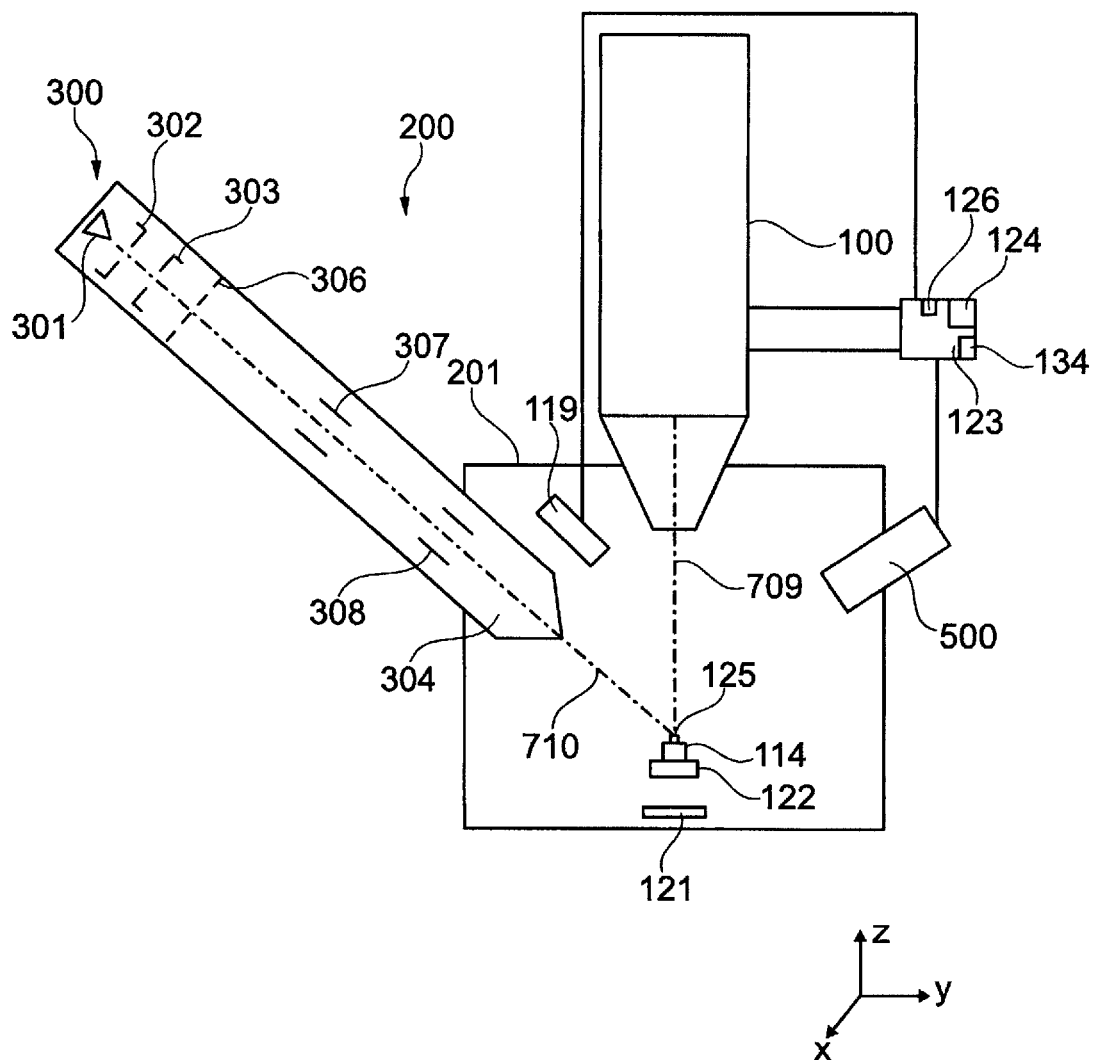
FIG. 2 shows a second illustrative embodiment of a particle beam device.

FIG. 2 shows a particle beam device in the form of a combination device 200. The combination device 200 may have two particle beam columns.

On one hand, the combination device 200 may be provided with the SEM 100, like the one depicted in FIG. 1, but without the object chamber 120. Rather, the SEM 100 may be arranged at an object chamber 201. The object chamber 201 may be under vacuum. For the purpose of generating the vacuum, a pump (not illustrated) may be arranged at the object chamber 201. In the illustrative embodiment illustrated in FIG. 2, the object chamber 201 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the object chamber 201 may be vacuum-sealed.

The third detector 121 may be arranged in the object chamber 201.

The SEM 100 serves to generate a first particle beam, namely the primary electron beam described further above, and may have the optical axis specified above, which is denoted with reference sign 709 in FIG. 2 and which is also referred to as first beam axis below.

On the other hand, the combination device 200 may be provided with an ion beam device 300, which may be likewise arranged at the object chamber 201. The ion beam device 300 likewise may have an optical axis, which is denoted with reference sign 710 in FIG. 2 and which is also referred to as second beam axis below.

The SEM 100 may be arranged vertically in relation to the object chamber 201. By contrast, the ion beam device 300 may be arranged inclined by an angle of approximately 50° in relation to the SEM 100. It may have a second beam generator in the form of an ion beam generator 301. Ions, which form a second particle beam in the form of an ion beam, may be generated by the ion beam generator 301. The ions may be accelerated by means of an extraction electrode 302, which may be at a predeterminable potential. The second particle beam then passes through ion optics of the ion beam device 300, wherein the ion optics may comprise a condenser lens 303 and a second objective lens 304. The second objective lens 304 ultimately generates an ion probe, which may be focused on the object 125 arranged on a processing unit 114. The processing unit 114 may be arranged at a movable object stage 122.

An adjustable or selectable aperture unit 306, a first electrode arrangement 307 and a second electrode arrangement 308 may be arranged above the second objective lens 304 (i.e., in the direction of the ion beam generator 301), wherein the first electrode arrangement 307 and the second electrode arrangement 308 may be embodied as scanning electrodes. The second particle beam may be scanned over the surface of the object 125 by means of the first electrode arrangement 307 and the second electrode arrangement 308, with the first electrode arrangement 307 acting in a first direction and the second electrode arrangement 308 acting in a second direction, which may be counter to the first direction. Using these arrangements, scanning may be carried out in e.g., an x-direction. The scanning in a y-direction perpendicular thereto may be performed by further electrodes (not depicted here), which may be rotated by 90°, at the first electrode arrangement 307 and at the second electrode arrangement 308.

As discussed above, the processing unit 114 may be arranged at the object stage 122. In the illustrative embodiment shown in FIG. 2, the object stage 122 also may be movable in three directions arranged perpendicular to each other, namely in an x-direction (first stage axis), in a y-direction (second stage axis) and in a z-direction (third stage axis). Moreover, the object stage 122 may be rotated about two rotational axes which may be arranged perpendicular to one another (stage rotation axes).

For the sake of clarity, in FIG. 2, the distances between the individual units of the combination device 200 are depicted disproportionately large in order to better illustrate the individual units of the combination device 200.

Arranged at the object chamber 201 may be a radiation detector 500, which may be used to detect interaction radiation, for example X-ray radiation and/or cathodoluminescence. In particular, the radiation detector 500 may be used for EDX. Moreover, the combination device 200 may comprise an EBSD detector 119 which may be arranged in the object chamber 201.

The radiation detector 500 may be connected to a monitoring unit 123, which may have a monitor 124. The monitoring unit 123 processes detection signals that may be generated by the first detector 116, the second detector 117 (not illustrated in FIG. 2), the EBSD detector 119, the third detector 121 and/or the radiation detector 500 and displays said detection signals, in particular in the form of images, on the monitor 124.

Furthermore, the combination device 200 may comprise a processor 126 into which a program code may be loaded for controlling the combination device 200 in such a way that a method according to the system described herein is carried out. Moreover, the monitoring 123 may comprise a database 134 for storing data.

Figure 3:
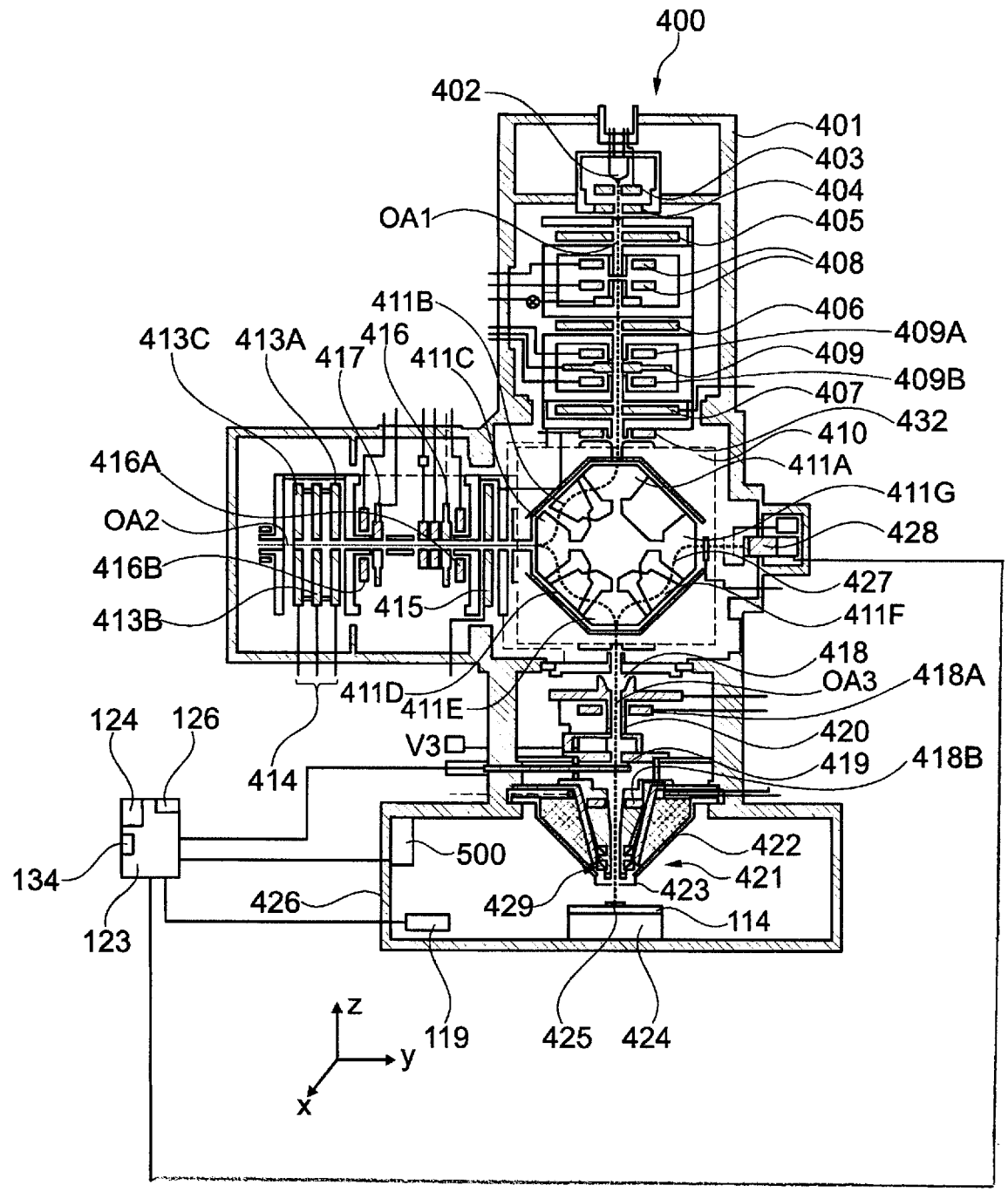
FIG. 3 shows a third illustrative embodiment of a particle beam device.

FIG. 3 is a schematic illustration of a further illustrative embodiment of a particle beam device according to the system described herein. This illustrative embodiment of the particle beam device is denoted with reference sign 400 and said illustrative embodiment comprises a mirror corrector for correcting e.g., chromatic and/or spherical aberrations. The particle beam device 400 may comprise a particle beam column 401, which may be embodied as an electron beam column and which substantially corresponds to an electron beam column of a corrected SEM. However, the particle beam device 400 may be not restricted to an SEM with a mirror corrector. Rather, the particle beam device 400 may comprise any type of correction units.

The particle beam column 401 may comprise a particle beam generator in the form of an electron source 402 (cathode), an extraction electrode 403, and an anode 404. By way of example, the electron source 402 may be embodied as a thermal field emitter. Electrons emerging from the electron source 402 may be accelerated to the anode 404 due to a potential difference between the electron source 402 and the anode 404. Accordingly, a particle beam in the form of an electron beam may be formed along a first optical axis OA1.

The particle beam may be guided along a beam path, which corresponds to the first optical axis OA1, after the particle beam has emerged from the electron source 402. A first electrostatic lens 405, a second electrostatic lens 406, and a third electrostatic lens 407 may be used to guide the particle beam.

Furthermore, the particle beam may be adjusted along the beam path using a beam-guiding device. The beam-guiding device of this illustrative embodiment comprises a source adjustment unit with two magnetic deflection units 408 arranged along the first optical axis OA1. Moreover, the particle beam device 400 may comprise electrostatic beam deflection units. A first electrostatic beam deflection unit 409, which may be also embodied as a quadrupole in a further embodiment, may be arranged between the second electrostatic lens 406 and the third electrostatic lens 407. The first electrostatic beam deflection unit 409 may be likewise arranged downstream of the magnetic deflection units 408. A first multi-pole unit 409A in the form of a first magnetic deflection unit may be arranged at one side of the first electrostatic beam deflection unit 409. Moreover, a second multipole unit 409B in the form of a second magnetic deflection unit may be arranged at the other side of the first electrostatic beam deflection unit 409. The first electrostatic beam deflection unit 409, the first multi-pole unit 409A, and the second multi-pole unit 409B may be used for orienting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 may be arranged at the entrance to the beam deflection device 410.

The beam deflection device 410 may be used as a particle beam deflector, which deflects the particle beam in a specific manner. The beam deflection device 410 may comprise a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and said particle beam may be deflected by the beam deflection device 410 in the direction of a second optical axis OA2.

The beam deflection may be performed by means of the first magnetic sector 411A, by means of the second magnetic sector 411B and by means of the third magnetic sector 411C by an angle of 30° to 120°. The second optical axis OA2 may be oriented at the same angle with respect to the first optical axis OA1. The beam deflection device 410 also deflects the particle beam, which may be guided along the second optical axis OA2, in the direction of a third optical axis OA3. The beam deflection may be provided by the third magnetic sector 411C, the fourth magnetic sector 411D, and the fifth magnetic sector 411E. In the illustrative embodiment according to FIG. 3, the deflection with respect to the second optical axis OA2 and with respect to the third optical axis OA3 may be provided by deflecting the particle beam by an angle of 90°. Hence, the third optical axis OA3 extends coaxially with the first optical axis OA1. However, reference is made to the fact that the particle beam device 400 according to the system described herein is not restricted to deflection angles of 90°. Rather, any suitable deflection angle may be selected by the beam deflection device 410, for example 70° or 110°, such that the first optical axis OA1 does not extend coaxially with the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam may be guided along the second optical axis OA2. The particle beam may be guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, they may be deflected to the third optical axis OA3 by the third magnetic sector 411C, the fourth magnetic sector 411D, and the fifth magnetic sector 411E.

The electrons of the particle beam emerge from the beam deflection device 410 and said electrons may be guided along the third optical axis OA3 to an object 425 that is intended to be examined and arranged on a processing unit 114. On its path to the object 425, the particle beam may be guided along a fifth electrostatic lens 418, a beam-guiding tube 420, a fifth multi-pole unit 418A, a sixth multi-pole unit 418B, and an objective lens 421. The fifth electrostatic lens 418 may be an electrostatic immersion lens. By means of the fifth electrostatic lens 418, the particle beam may be decelerated or accelerated to an electric potential of the beam-guiding tube 420.

By means of the objective lens 421, the particle beam may be focused in a focal plane in which the object 425 is arranged. The object 425 may be arranged on a processing unit 114 which is arranged on a movable object stage 424. The movable object stage 424 may be arranged in an object chamber 426 of the particle beam device 400. The object stage 424 may be embodied to be movable in three directions arranged perpendicular to each another, namely in an x-direction (first stage axis), in a y-direction (second stage axis) and in a z-direction (third stage axis). Moreover, the object stage 424 may be rotated about two rotational axes which may be arranged perpendicular to one another (stage rotation axes).

The object chamber 426 may be under vacuum. For the purpose of generating the vacuum, a pump (not illustrated) may be arranged at the object chamber 426. In the illustrative embodiment illustrated in FIG. 3, the object chamber 426 may be operated in a first pressure range or in a second pressure range. The first presto sure range may comprise only pressures of less than or equal to $10^{-3}$ hPa, and the second pressure range may comprise only pressures of greater than $10^{-3}$ hPa. To ensure said pressure ranges, the object chamber 426 may be vacuum-sealed.

The objective lens 421 may be embodied as a combination of a magnetic lens 422 and a sixth electrostatic lens 423. Further, the end of the beam-guiding tube 420 may be an electrode of an electrostatic lens. After emerging from the beam-guiding tube 420, particles of the particle beam device 400 may be decelerated to a potential of the object 425. The objective lens 421 is not restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which may be focused onto the object 425 may interact with the object 425. Interaction particles may be generated. In particular, secondary electrons may be emitted from the object 425 or backscattered electrons may be scattered back at the object 425. The secondary electrons or the backscattered electrons may be accelerated again and guided into the beam-guiding tube 420 along the third optical axis OA3. In particular, the trajectories of the secondary electrons and the backscattered electrons extend on the route of the beam path of the particle beam in the direction opposite to that of the particle beam.

The particle beam device 400 may comprise a first analysis detector 419 which may be arranged between the beam deflection device 410 and the objective lens 421 along the beam path. Secondary electrons traveling in directions oriented at a large angle with respect to the third optical axis OA3 may be detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and may be deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 may generate detection signals which may be largely generated by emitted secondary electrons. The detection signals which are generated by the first analysis detector 419 may be guided to a monitoring unit 123 and used to obtain information about the properties of the interaction region of the focused particle beam with the object 425. In particular, the focused particle beam may be scanned over the object 425 using a scanning device 429. Then, an image of the scanned region of the object 425 may be generated by the detection signals, which may be generated by the first analysis detector 419, and it may be displayed on a display unit. The display unit is for example a monitor 124 that is arranged at the monitoring unit 123.

The second analysis detector 428 may be also connected to the monitoring unit 123. Detection signals of the second analysis detector 428 may be supplied to the monitoring unit 123 and used to generate an image of the scanned region of the object 425 and to display it on a display unit. The display unit is for example the monitor 124 that is arranged at the monitoring unit 123.

Arranged at the object chamber 426 may be a radiation detector 500, which may be used to detect interaction radiation, for example X-ray radiation and/or cathodoluminescence. In particular, the radiation detector 500 may be used for EDX. Moreover, an EBSD detector 119 may be arranged in the object chamber 426. The radiation detector 500 and the EBSD detector 119 may be connected to the monitoring unit 123, which may have the monitor 124. The monitoring unit 123 processes detection signals generated by the radiation detector 500 and the EBSD detector 119 and displays them on the monitor 124, in particular in the form of images.

Furthermore, the particle beam device 400 may comprise a processor 126 into which a program code may be loaded for controlling the particle beam device 400 in such a way that a method according to the system described herein is carried out. Moreover, the monitoring 123 may comprise a database 134 for storing data.

Figure 4:
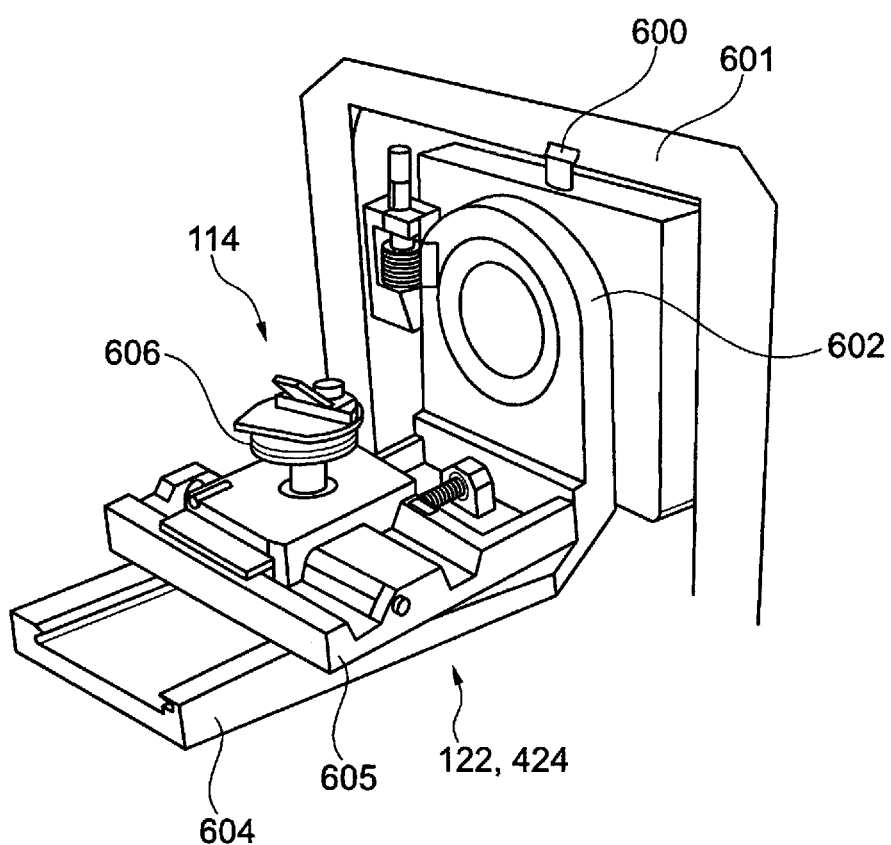
FIG. 4 shows a schematic illustration of an illustrative embodiment of a movable object stage for a particle beam device.

The object stage 122, 424 of the particle beam devices 100, 200 and 400 explained above will now be discussed in more detail. The object stage 122, 424 may be a movable object stage, which is illustrated schematically in FIGS. 4 and 5. Reference is made to the fact that the system described herein is not restricted to the object stage 122, 424 described here. Rather, the system described herein may have any movable object stage that is suitable for the system described herein.

Arranged on the object stage 122, 424 may be the processing unit 114, in which, in turn, the object 125, 425 may be arranged. The object stage 122, 424 may have movement elements that ensure a movement of the object stage 122, 424 in such a way that a region of interest on the object 125, 425 may be examined by means of a particle beam. The movement elements are illustrated schematically in FIGS. 4 and 5 and are explained below.

The object stage 122, 424 may have a first movement element 600 at a housing 601 of the object chamber 120, 201 or 426, in which the object stage 122, 424 may be arranged. The first movement element 600 facilitates a movement of the object stage 122, 424 along the z-axis (third stage axis). Further, provision may be made of a second movement element 602. The second movement element 602 facilitates a rotation of the object stage 122, 424 about a first stage rotation axis 603, which is also referred to as a tilt axis. This second movement element 602 serves to tilt an object 125, 425 arranged in the processing unit 114 about the first stage rotation axis 603.

Arranged at the second movement element 602, in turn, may be a third movement element 604 that may be embodied as a guide for a carriage and that ensures that the object stage 122, 424 is movable in the x-direction (first stage axis). The aforementioned carriage may be a further movement element in turn, namely a fourth movement element 605. The fourth movement element 605 may be embodied in such a way that the object stage 122, 424 is movable in the y-direction (second stage axis). To this end, the fourth movement element 605 may have a guide in which a further carriage may be guided, the processing unit 114 in turn being arranged at the latter.

The processing unit 114 may be embodied, in turn, with a fifth movement element 606 that facilitates a rotation of the processing unit 114 about a second stage rotation axis 607. The second stage rotation axis 607 may be oriented perpendicular to the first stage rotation axis 603.

The object stage 122, 424 of the illustrative embodiment discussed here may have the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further illustrative embodiment (not illustrated here), provision is made for further movement elements to be arranged at the object stage 122, 424 such that movements along further translational axes and/or about further rotational axes may be facilitated.

Figure 5:
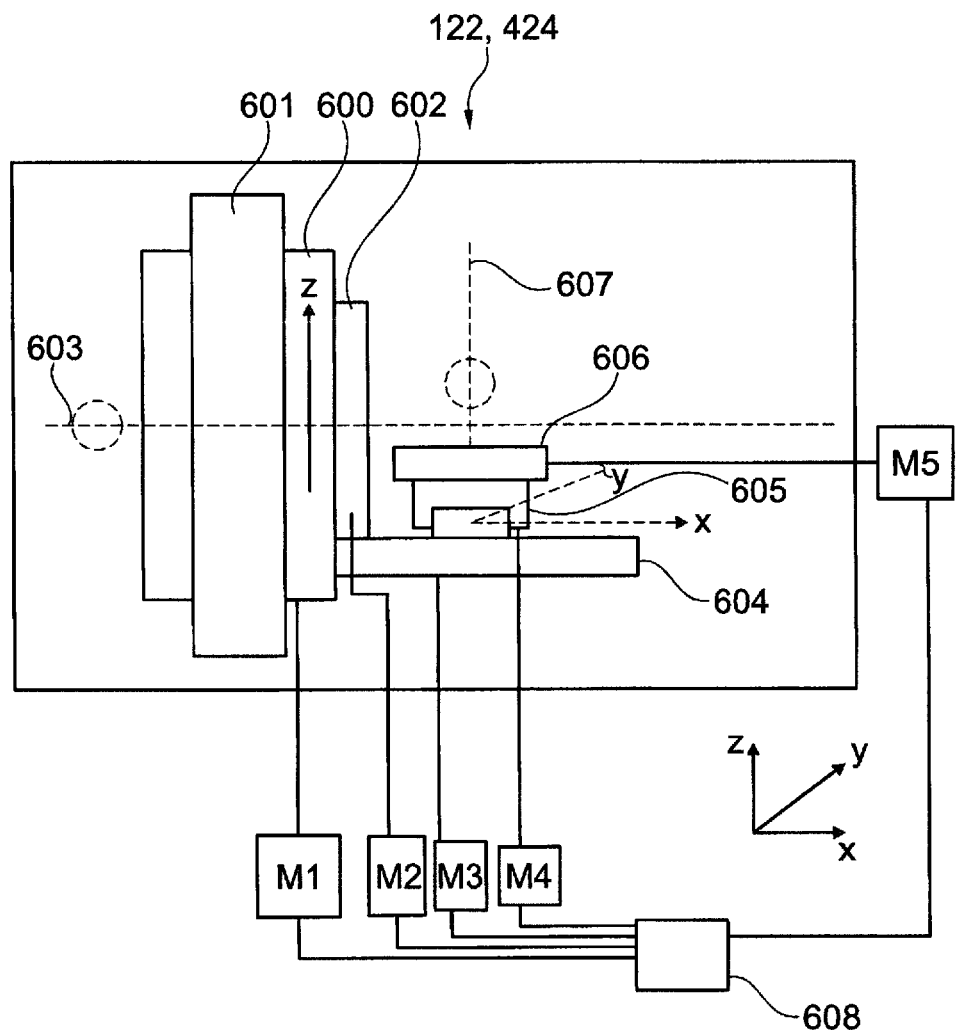
FIG. 5 shows a further schematic illustration of the object stage according to FIG. 4.

It is clear from FIG. 5 that each of the aforementioned movement elements may be connected to a stepper motor. Thus, the first movement element 600 may be connected to a first stepper motor M1 and the former may be driven on account of a driving force that may be provided by the first stepper motor M1. The second movement element 602 may be connected to a second stepper motor M2, which drives the second movement element 602. The third movement element 604, in turn, may be connected to a third stepper motor M3. The third stepper motor M3 provides a driving force for driving the third movement element 604. The fourth movement element 605 may be connected to a fourth stepper motor M4, wherein the fourth stepper motor M4 drives the fourth movement element 605. Further, the fifth movement element 606 may be connected to a fifth stepper motor M5. The fifth stepper motor M5 generates a driving force that drives the fifth movement element 606. The aforementioned stepper motors M1 to M5 may be controlled by a control unit 608 (see FIG. 5).

Figure 6:
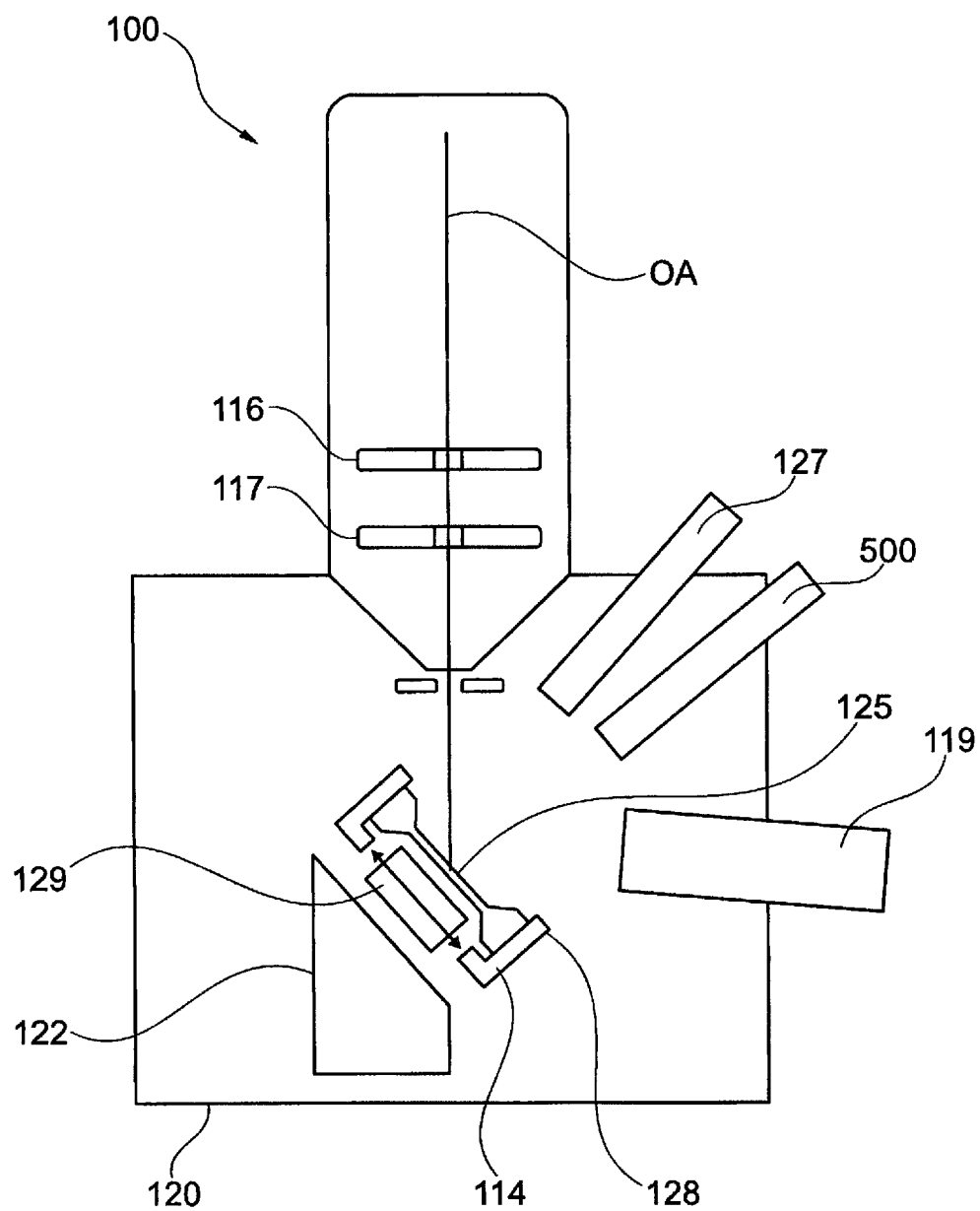
FIG. 6 shows a schematic illustration of the particle beam device according to FIG. 1.

FIG. 6 shows a schematic illustration of the SEM 100 shown in FIG. 1 and an illustrative embodiment of the processing unit 114 being arranged in the object chamber 120 of the SEM 100. The same reference signs refer to the same units. What is said about the processing unit 114 of the SEM 100 mutatis mutandis also applies to the processing units 114 of the further particle beam devices 200 and 400.

As shown in FIG. 6, the SEM 100 further may comprise a chamber detector 127 arranged at the object chamber 120. The chamber detector 127 may be a particle detector, in particular an Everhart Thornley detector.

As mentioned above, the processing unit 114 may be arranged at the object stage 122. The processing unit 114 may comprise a mechanical force application module 128 and a temperature module 129 for heating or cooling the object 125. Using the mechanical force application module 128, a tensile force, a shearing force, a bending force and/or a torsion force may be applied to the object 125.

Figure 7:
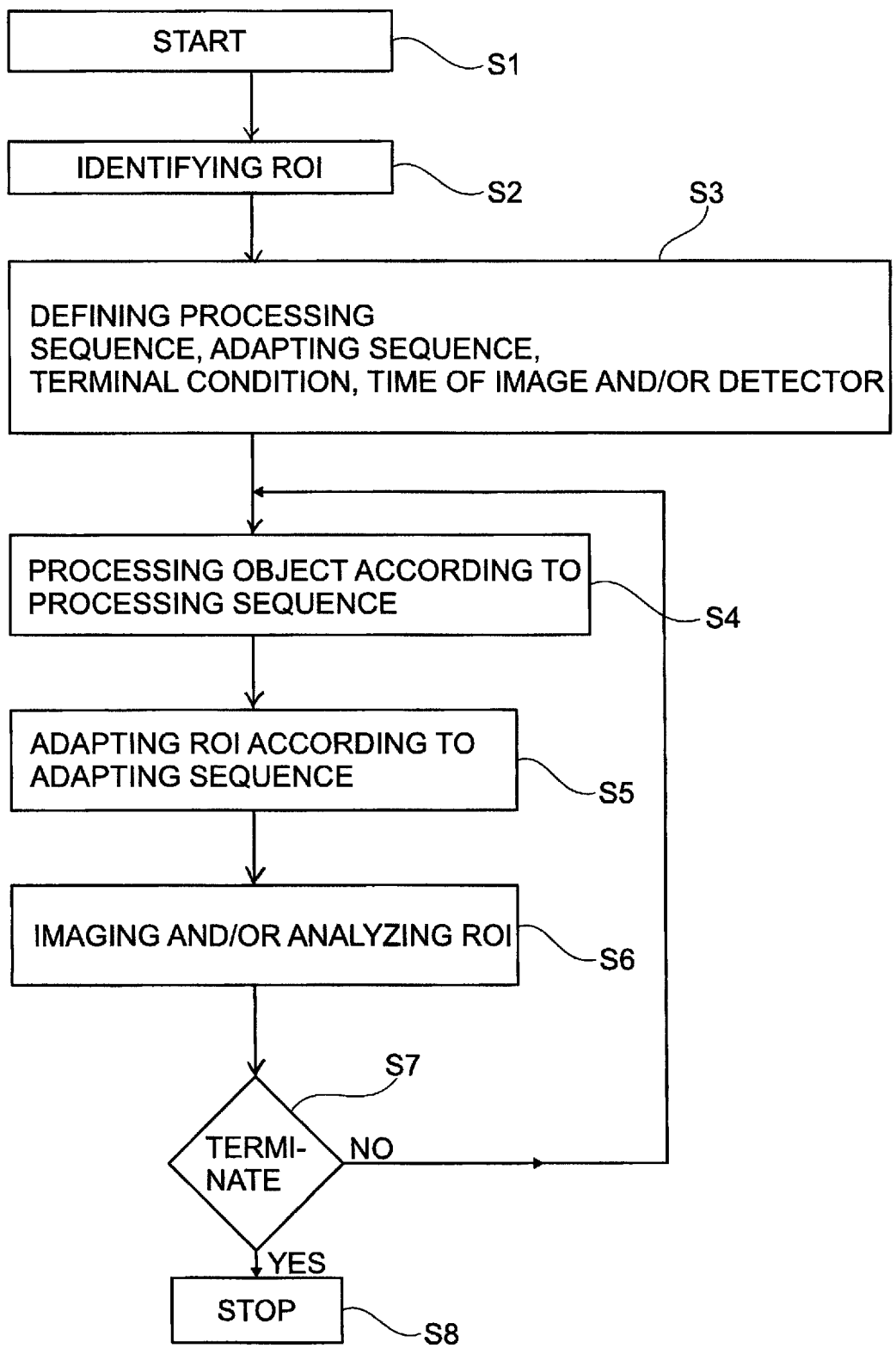
FIG. 7 shows an illustrative embodiment of a method for operating a particle beam device.

FIG. 7 shows an illustrative embodiment of a method according to the system described herein for operating the particle beam device in the form of the SEM 100, of the combination device 200 or of the particle beam device 400. The method is explained in an illustrative fashion below on the basis of the operation of the SEM 100. What is said about operating the SEM 100 mutatis mutandis also applies to the methods for operating the further particle beam devices 200 and 400.

Figure 8:
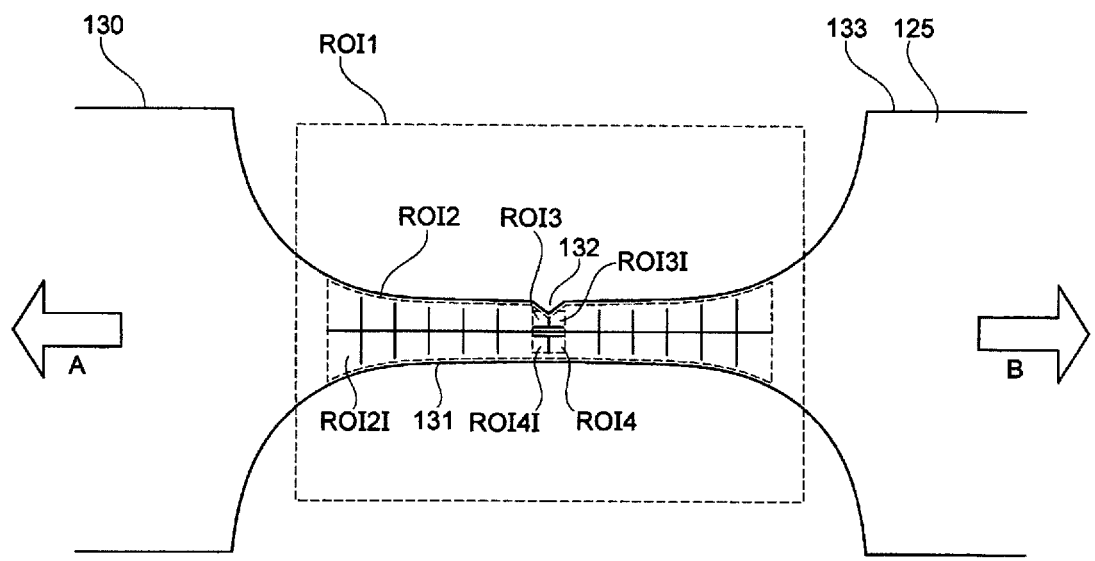
FIG. 8 shows a schematic illustration of an object to be examined.

In an embodiment of the method according to the system described herein, after having started the method in method step S1, at least one region of interest may be identified on the object 125 in method step S2. For example, a first region of interest ROI1, a second region of interest ROI2, a third region of interest ROI3 and a fourth region of interest ROI4 are identified as shown in FIG. 8. FIG. 8 shows the object 125 comprising a first section 130 having a first extension, a second section 131 having a second extension and a third section 133 having the first extension. The first extension may be larger than the second extension.

For example, the first region of interest ROI1 may be defined by the field of view of the SEM 100 and covers nearly the whole area between the first section 130 and the third section 133 of the object 125. The first region of interest ROI1 may be shaped as a rectangle. Furthermore, the second region of interest ROI2 may be defined by a polygon having nearly the shape of the second section 131 of the object 125 and covers nearly the whole area of the second section 131 of the object 125. Moreover, the third region of interest ROI3 may be defined by a polygon having nearly the shape of a square and covers an area adjacent to a dent 132 being arranged at the second section 131 of the object 125. Furthermore, the fourth region of interest ROI4 may be defined by a polygon having nearly the shape of a square and covers an area adjacent to the third region of interest ROI3.

The first region of interest ROI1 may be imaged with the SEM 100 using a low magnification and using a larger pixel size than the pixel size used for imaging the second region of interest ROI2, the third region of interest ROI3 and the fourth region of interest ROI4. The first region of interest ROI1 may be imaged using a single scan, whereas the second region of interest ROI2, the third region of interest ROI3 and the fourth region of interest ROI4 may be subdivided and segmented into several sub regions of interest each, wherein each sub region of interest may be imaged using a smaller pixel size than the pixel size which may be used for imaging the first region of interest ROI1. The second region of interest ROI2 may comprise several sub regions ROI2I, the third region of interest ROI3 may comprise several sub regions ROI3I and the fourth region of interest ROI4 may comprise several sub regions ROI4I. Images of the several sub regions of interest belonging to a single region of interest, for example the sub regions of interest ROI2I belonging to the second region of interest ROI2, may be stitched together to generate a complete image of this specific region of interest. Stitching techniques are known in the art and, therefore, are not discussed herein. Images of the first region of interest ROI1, the second region of interest ROI2, the third region of interest ROI3 and the fourth region of interest ROI4 may be generated using the SEM 100.

It is additionally or alternatively provided in an embodiment of the method according to the system described herein that an optical microscope and/or a camera is used for identifying the region of interest.

In method step S3, a processing sequence for processing the object 125, an adapting sequence for adapting the aforementioned regions of interest ROI1 to ROI4 depending on the processing sequence (that is according to the processing sequence) and/or a terminal condition may be defined, for example by the operator of the SEM 100. Moreover, additionally or alternatively, the time of generating an image and/or the detector used for generating the image may be defined.

The processing sequence for processing the object 125 may comprise at least one step for processing the object 125. In particular, the processing sequence may comprise information about whether a force is applied to the object 125 and/or an indication of the time when the force is applied to the object 125. In particular, a tensile force, a compressive force, a shearing force, a bending force and/or a torsion force may be applied to the object 125. Moreover, the processing sequence may comprise information about whether the object 125 is heated up to or cooled down to a specific temperature and/or an indication of the time when the object 125 is heated or cooled. In particular, the processing sequence may comprise the following information and steps of proceeding:

- a start condition and an end condition. The start condition may comprise information about the initial condition of the object 125, for example the initial displacement or the initial temperature of the object 125. The end condition may comprise information about a specific condition of the object 125. Embodiments of the specific condition are mentioned further below. When the end condition is reached, the method according to the system described herein may be stopped;
- choosing a parameter which is controlled when carrying out the method according to the system described herein. For example, the parameter may be the force applied to the object 125, a displacement of the object 125, a strain on the object 125 (i.e., the deformation of the object 125) and/or the temperature of the object 125;
- defining a rate of change of the parameter, for example a rate of increase of the force applied to the object 125, a rate of increase of the speed of movement of the object 125 for achieving the displacement of the object 125, a strain rate of the object 125 and/or a rate of increase or decrease of the temperature of the object 125;
- choosing the times when images of at least one of the following regions of interest are generated using the SEM 100: the first region of interest ROI1, the second region of interest ROI2, the third region of interest ROI3 and the fourth region of interest ROI4. For example, it may be defined after which steps the increase or decrease of the parameter is paused. In this pause, images of at least one of the following regions of interest may be generated using the SEM 100: the first region of interest ROI1, the second region of interest ROI2, the third region of interest ROI3 and the fourth region of interest ROI4.

An embodiment of the method according to the system described herein may comprise at least one of the following processing sequences:

Sequence 1:
(i) start the processing sequence from 0 mm displacement of the object 125 and terminate (i.e., end) the processing sequence when the object 125 brakes;
(ii) move a first end of the object 125 in a first direction A and move a second end of the object 125 in a second direction B opposite to the first direction A at the same time (see FIG. 8) with a velocity of 2 µm/s;
(iii) pause the movement of the object 125 at each 10 µm deformation of the object 125 for generating images of at least one of the following regions of interest using the SEM 100: the first region of interest ROI1, the second region of interest ROI2, the third region of interest ROI3 and the fourth region of interest ROI4. If one of the aforementioned regions of interest ROI1 to ROI4 is subdivided into several sub regions of interest, generate images of the several sub regions of interest and stitch the images together to generate a complete image of the specific region of interest;
(iv) continue the processing sequence after generating the aforementioned images.

Sequence 2:
(i) start the processing sequence from 0 N bending force and increase the bending force in steps of 10 N per minute until the force reaches 1000 N. When the force has reached 1000 N, terminate (i.e., end) the processing sequence;
(ii) pause the increase after each 50 N increase for generating images of at least one of the following regions of interest using the SEM 100: the first region of interest ROI1, the second region of interest ROI2, the third region of interest ROI3 and the fourth region of interest ROI4. If one of the aforementioned regions of interest ROI1 to ROI4 is subdivided into several sub regions of interest, generate images of the several sub regions of interest and stitch the images together to generate a complete image of the specific region of interest;
(iii) continue the processing sequence after generating the aforementioned images.

Sequence 3:
(i) start the processing sequence from 0% strain and increase the strain force in steps of 10 ppm per second until the strain reaches 5%. When the strain has reached 5%, terminate (i.e., end) the processing sequence;
(ii) pause the increase after each 100 ppm increase for generating images of at least one of the following regions of interest using the SEM 100: the first region of interest ROI1, the second region of interest ROI2, the third region of interest ROI3 and the fourth region of interest ROI4. If one of the aforementioned regions of interest ROI1 to ROI4 is subdivided into several sub regions of interest, generate images of the several sub regions of interest and stitch the images together to generate a complete image of the specific region of interest;

(iii) continue the processing sequence after generating the aforementioned images.

Sequence 4:
(i) apply a bending force to the object 125 and keep the bending force constant at 1 kN at all times;
(ii) start the processing sequence from a temperature of the object 125 of 20° C. and increase the temperature of the object 125 until the temperature of the object 125 reaches 500° C. When the temperature of the object 125 reaches 500° C., terminate (i.e., end) the processing sequence;
(iii) pause the increase of the temperature after each 10° C. increase for generating images of at least one of the following regions of interest using the SEM 100: the first region of interest ROI1, the second region of interest ROI2, the third region of interest ROI3 and the fourth region of interest ROI4. If one of the aforementioned regions of interest ROI1 to ROI4 is subdivided into several sub regions of interest, generate images of the several sub regions of interest and stitch the images together to generate a complete image of the specific region of interest;
(iv) continue the processing sequence after generating the aforementioned images.

Sequence 5:
(i) apply a 1 mm displacement to the object 125 by applying a bending force to the object 125 and keep this displacement of the object 125 constant at all times;
(ii) apply a temperature of 500° C. to the object 125 by heating and/or cooling the object 125 and keep this temperature constant at all times;
(iii) after each 5 minutes, generate images of at least one of the following regions of interest using the SEM 100: the first region of interest ROI1, the second region of interest ROI2, the third region of interest ROI3 and the fourth region of interest ROI4. If one of the aforementioned regions of interest ROI1 to ROI4 is subdivided into several sub regions of interest, generate images of the several sub regions of interest and stitch the images together to generate a complete image of the specific region of interest;
(iv) continue the processing sequence after generating the aforementioned images.

It is explicitly mentioned that the system described herein is not restricted to the aforementioned sequences. Rather, any sequence which is suitable for the system described herein may be used.

Figure 9A:
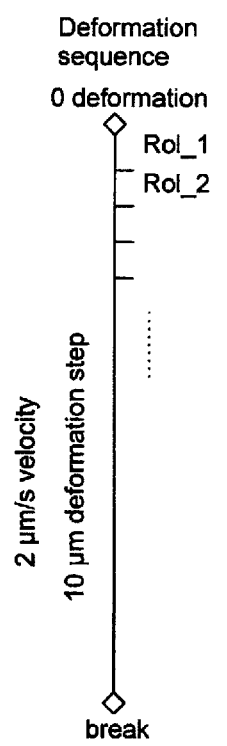
FIG. 9A shows a schematic illustration of a processing sequence.
Figure 9B:
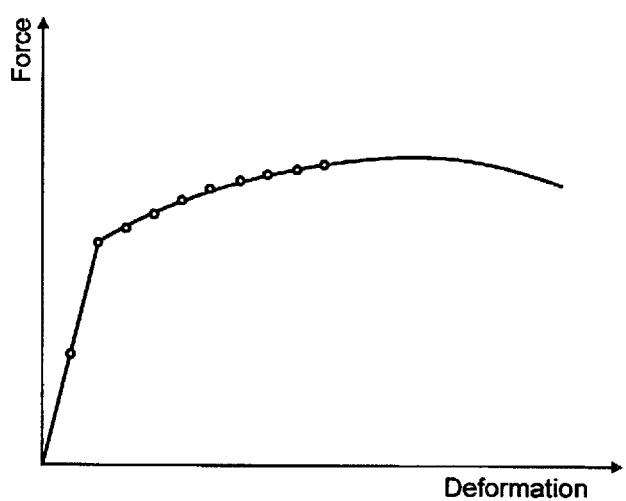
FIG. 9B shows a schematic illustration of an applied force in dependency of the deformation of an object.

FIGS. 9A and 9B illustrate sequence 1. As shown in FIG. 9A, the processing sequence starts from 0 mm displacement of the object 125 (i.e., 0 deformation) and terminates (i.e., ends) when the object 125 brakes. The first end of the object 125 may be moved in a first direction A and the second end of the object 125 may be moved in a second direction B opposite to the first direction A at the same time with a velocity of 2 μm/s. The movement of the object 125 may be paused at each 10 μm deformation of the object 125 for generating images of the first region of interest ROI1 and the second region of interest ROI2 using the SEM 100. Since the second region of interest ROI2 may be subdivided into several sub regions of interest ROI2I, images of the several sub regions of interest ROI2I may be generated and may be stitched together to generate a complete image of the second region of interest ROI2. FIG. 9B shows a schematic illustration of the applied force in dependency of the deformation of the object 125. The images may be generated at each dot of the schematic illustration shown in FIG. 9B.

In a further embodiment of the method according to the system described herein, the method provides a single processing sequence comprising sequence information and steps of proceeding. Additionally, the further embodiment of the method according to the system described herein provides for several imaging tasks. The single processing sequence may comprise:

a start condition and an end condition. The start condition may comprise information about the initial condition of the object 125, for example the initial displacement or the initial temperature of the object 125. The end condition may comprise information about a specific condition of the object 125. Embodiments of the specific condition are mentioned further below. When the end condition is reached, the method according to the system described herein may be stopped;

a parameter which is controlled when carrying out the processing sequence. For example, the parameter may be a force applied to the object 125, a displacement of the object 125, a strain on the object 125 (i.e., the deformation of the object 125) and/or the temperature of the object 125; and a definition of a rate of change of the parameter, for example a rate of increase of the force applied to the object 125, a rate of increase of the speed of movement of the object 125 for achieving the displacement of the object 125, a strain rate of the object 125 and/or a rate of increase or decrease of the temperature of the object 125.

Each of the several imaging tasks may comprise the following information and steps:

a parameter which is controlled when carrying out the processing sequence. For example, the parameter may be a force applied to the object 125, a displacement of the object 125, a strain on the object 125 (i.e., the deformation of the object 125) and/or the temperature of the object 125; and times when images of at least one of the following regions of interest may be generated using the SEM 100: the first region of interest ROI1, the second region of interest ROI2, the third region of interest ROI3 and the fourth region of interest ROI4. For example, it may be defined after which steps the increase or decrease of the parameter is paused. In this pause, images of at least one of the following regions of interest may be generated using the SEM 100: the first region of interest ROI1, the second region of interest ROI2, the third region of interest ROI3 and the fourth region of interest ROI4.

This further embodiment of the method according to the system described herein is discussed in more detail further below. The further embodiment may comprise the following processing sequence:

Processing Sequence:
(i) start the processing sequence from 0 mm displacement of the object 125 and terminate (i.e., end) the processing sequence when the object 125 brakes;
(ii) move the first end of the object 125 in a first direction A and move the second end of the object 125 in a second direction B opposite the first direction A at the same time (see FIG. 8) with a velocity of 2 μm/s.

Moreover, the further embodiment may comprise the following imaging tasks:

Imaging Task 1:
(i) monitor the deformation of the object 125;
(ii) pause the movement of the object 125 at each 10 μm deformation step of the object 125 for generating images of the first region of interest ROI1 and the second region of interest ROI2. Since the second region of interest ROI2 may be subdivided into several sub regions of interest ROI2I, images of the several sub regions of interest ROI2I may be generated and may be stitched together to generate a complete image of the second region of interest ROI2;

(iii) continue the processing sequence after generating the aforementioned images.

Imaging Task 2:

(i) monitor the strain on the object 125;

(ii) pause the movement of the object 125 after each 0.1% strain step for generating images of the third region of interest ROI3 using the SEM 100. Since the third region of interest ROI3 may be subdivided into several sub regions of interest ROI3I, images of the several sub regions of interest ROI3I may be generated and may be stitched together to generate a complete image of the third region of interest ROI3;

(iii) continue the processing sequence after generating the aforementioned images until the tensile strength limit of the object 125 has been reached or is exceeded.

Imaging Task 3:

(i) monitor the deformation of the object 125;

(ii) if the elastic limit of the object 125 has been reached or may be exceeded, pause the movement of the object 125 at each 20 µm deformation step of the object 125 for generating images of the fourth region of interest ROI4. Since the fourth region of interest ROI4 may be subdivided into several sub regions of interest ROI4I, images of the several sub regions of interest ROI4I may be generated and may be stitched together to generate a complete image of the fourth region of interest ROI4;

(iii) continue the processing sequence after generating the aforementioned images until the tensile strength limit of the object 125 has been reached or is exceeded.

In this further embodiment of the method according to the system described herein, the processing sequence and the imaging tasks 1 to 3 may be carried out in parallel. It is explicitly mentioned that the system described herein is not restricted to the aforementioned processing sequence or imaging tasks. Rather, any processing sequence or imaging task which is suitable for the system described herein may be used.

FIGS. 10A to 10E illustrate the further embodiment of the method according to the system described herein as described above.

Figure 10A:
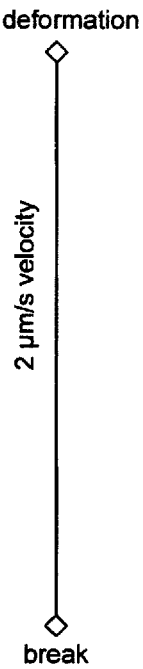
FIG. 10A shows a schematic illustration of a further processing sequence.

As shown in FIG. 10A, the processing sequence starts from 0 mm displacement of the object 125 (i.e., 0 deformation) and terminates (i.e., ends) when the object 125 brakes. The first end of the object 125 may be moved in a first direction A and the second end of the object may be moved in a second direction B opposite the first direction A at the same time with a velocity of 2 µm/s.

Figure 10B:
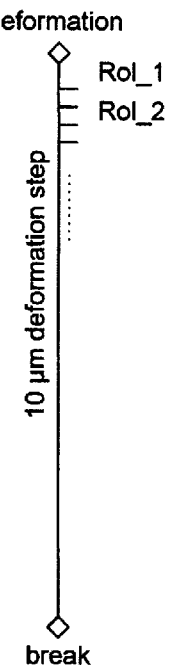
FIG. 10B shows a schematic illustration of a first imaging task.

As shown in FIG. 10B, imaging task 1 provides for monitoring the deformation of the object 125. The movement of the object 125 may be paused at each 10 µm deformation step of the object 125 for generating images of the first region of interest ROI1 and the second region of interest ROI2 using the SEM 100. Since the second region of interest ROI2 may be subdivided into several sub regions of interest ROI2I, images of the several sub regions of interest ROI2I may be generated and may be stitched together to generate a complete image of the second region of interest ROI2. After having generated the aforementioned images, the processing sequence and, therefore, the movement of the object 125 may be continued.

Figure 10C:
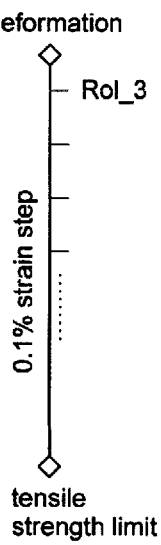
FIG. 10C shows a schematic illustration of a second imaging task.

As shown in FIG. 10C, imaging task 2 provides for monitoring the strain on the object 125. The movement of the object 125 may be paused after each 0.1% strain step for generating images of the third region of interest ROI3 using the SEM 100. Since the third region of interest ROI3 may be subdivided into several sub regions of interest ROI3I, images of the several sub regions of interest ROI3I may be generated and may be stitched together to generate a complete image of the third region of interest ROI3. After having generated the aforementioned images, the processing sequence and, therefore, the movement of the object 125 may be continued until the tensile strength limit of the object 125 has been reached or is exceeded.

Figure 10D:
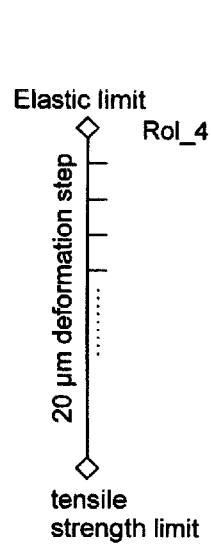
FIG. 10D shows a schematic illustration of a third imaging task.

As shown in FIG. 10D, imaging task 3 provides for monitoring the deformation of the object 125. If the elastic limit of the object 125 has been reached or is exceeded, the movement of the object 125 may be paused at each 20 µm deformation step of the object 125 for generating images of the fourth region of interest ROI4. Since the fourth region of interest ROI4 may be subdivided into several sub regions of interest ROI4I, images of the several sub regions of interest ROI4I may be generated and may be stitched together to generate a complete image of the fourth region of interest ROI4. After having generated the aforementioned images, the processing sequence and, therefore, the movement of the object 125 may be continued until the tensile strength limit of the object 125 has been reached or is exceeded.

Figure 10E:
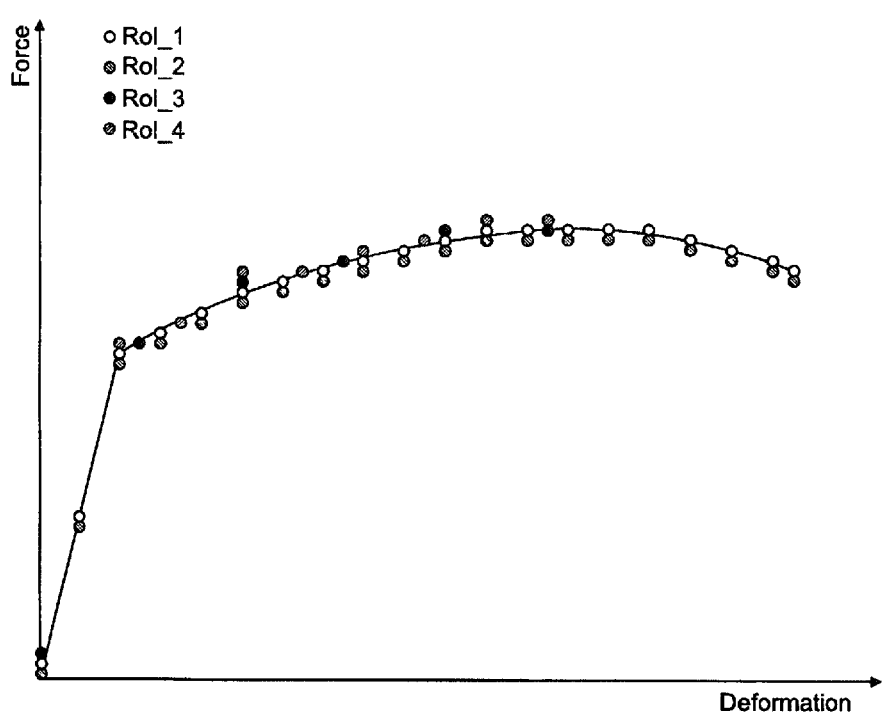
FIG. 10E shows a further schematic illustration of an applied force in dependency of the deformation of an object.

FIG. 10E shows a schematic illustration of the applied force in dependency of the deformation of the object 125. Images of at least one of the regions of interest ROI1 to ROI4 may be generated at each dot of the schematic illustration according to the imaging tasks 1 to 3.

As mentioned above, in method step S3 according to FIG. 7, an adapting sequence for adapting the aforementioned regions of interest ROI1 to ROI4 depending on the processing sequence (that is according to the processing sequence) also may be defined, for example by the operator of the SEM 100. When processing the object 125, in particular by applying a force to the object 125, an initial position of the regions of interest ROI1 to ROI4 on the object 125 may change. Without an active adaption of the position of the regions of interest ROI1 to ROI4, a feature which an operator is interested in may drift outside of the initial regions of interest ROI1 to ROI4. Therefore, the regions of interest ROI1 to ROI4 should be adapted. The adapting sequence may be used for adapting the regions of interest ROI1 to ROI4 depending on the processing sequence (that is according to the processing sequence). Two embodiments of the adapting sequence may be explained below. The operator of the SEM 100 may choose one of them for being carried out in the method shown in FIG. 7.

An embodiment of the adapting sequence uses a cross correlation for adapting the regions of interest ROI1 to ROI4, for example the first region of interest ROI1. During the cross correlation (a) a first image of the first region of interest ROI1 may be obtained first, (b) after a step of movement of the object 125 or heating and/or cooling the object 125, a second image of the first region of interest ROI1 may be obtained second, (c) a shift between the first image and the second image of the first region of interest ROI1 may be calculated using the processor 126, and (d) the shift is used for adapting the first region of interest ROI1. This is explained in more detail with respect to FIGS. 11A to 11C referring to a single region of interest ROI.

The region of interest ROI may be defined by specifying coordinates $x_i, y_i$ of each node of the region of interest ROI in the form of a polygon. Using these coordinates of each node, a centroid of the region of interest ROI may be calculated by means of the processor 126 using the following equations:

$$C_x = \frac{1}{6A}\sum_{i=0}^{n-1}(x_i + x_{i+1}) \cdot (x_i \cdot y_{i+1} - x_{i+1} \cdot y_i) \quad [1]$$

$$C_y = \frac{1}{6A}\sum_{i=0}^{n-1}(y_i + y_{i+1}) \cdot (x_i \cdot y_{i+1} - x_{i+1} \cdot y_i) \quad [2]$$

wherein A is the area of the polygon given by $$A = \tfrac{1}{2}\sum_{i=0}^{n-1}(x_i \cdot y_{i+1} - x_{i+1} \cdot y_i) \quad [3]$$

Figure 11A:
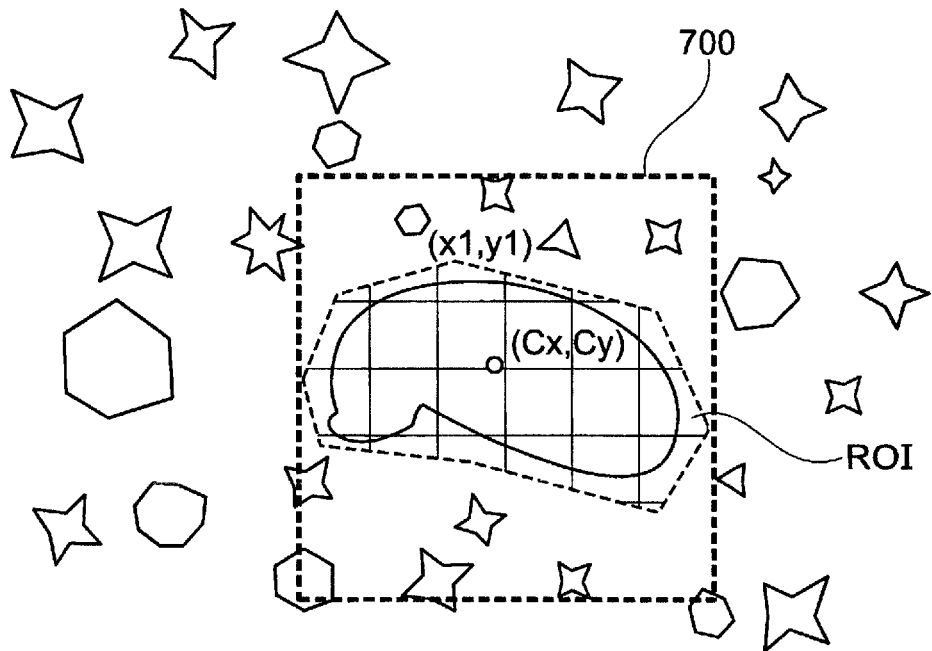
FIG. 11A shows a schematic illustration of a region of interest to be adapted using an adapting sequence.

As shown in FIG. 11A, after having generated an image of the region of interest ROI, an additional image 700 comprising the region of interest ROI may be generated, which additional image 700 may be centered at the centroid of the polygon given by $C_x, C_y$. As mentioned above, the region of interest ROI may be shaped as a polygon. The field of view of the SEM covers the complete polygon. A low magnification of the SEM 100 may be used for generating the additional image 700. The additional image 700 may be saved in the database 134 of the monitoring unit 123 as a reference image.

Figure 11B:
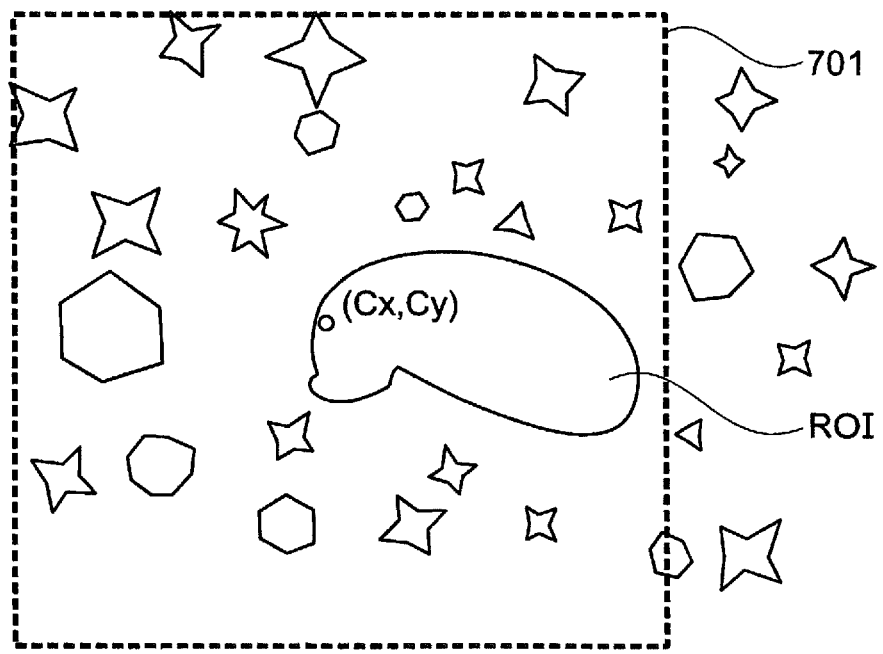
FIG. 11B shows a further schematic illustration of the region of interest according to FIG. 11A.

After the object 125 has been deformed in one of the steps of the processing sequence, features of the object 125 which the operator is interested in may be moved (i.e., shifted) from their initial coordinates to further coordinates after deformation of the object 125. As shown in FIG. 11B, a further additional image 701 comprising the region of interest may be generated after deformation of the object 125, which further additional image 701 also may be centered at the above mentioned centroid of the polygon given by $C_x, C_y$. A low magnification of the SEM 100 may be used for generating the further additional image 701 as well. The shift of the feature now may be determined by correlating the reference image which is the additional image 700 comprising the region of interest ROI with the further additional image 701 comprising the region of interest ROI. The shift is indicated by a shift vector $(d_x, d_y)$.

Figure 11C:
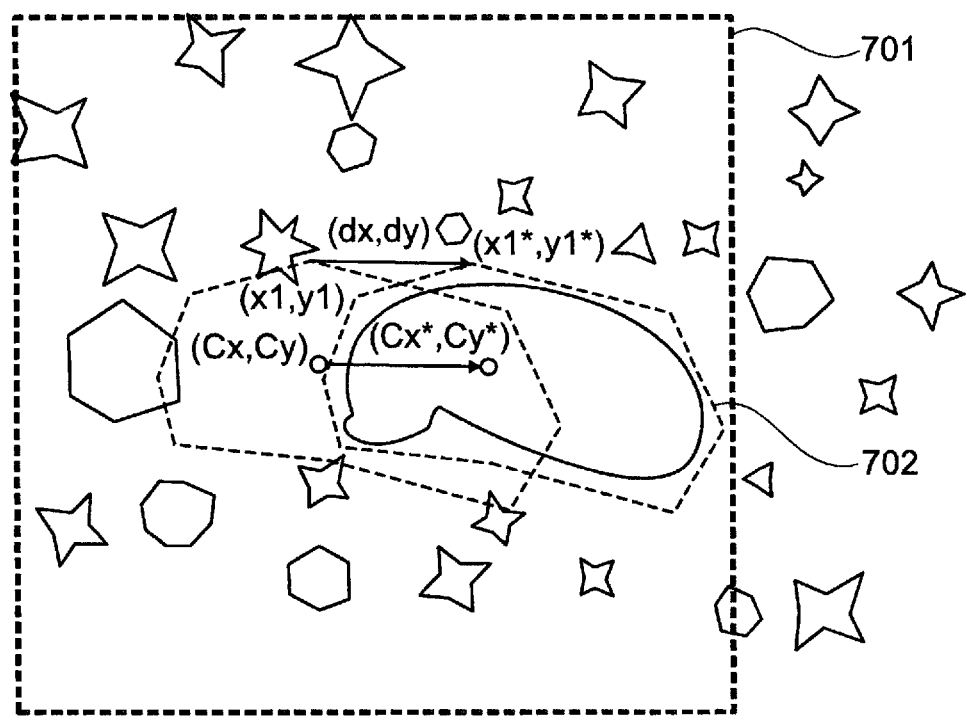
FIG. 11C shows a schematic illustration of an adapted region of interest.

Using the shift vector $(d_x, d_y)$, the coordinates of the nodes of the region of interest ROI in the shape of a polygon then may be recalculated. Moreover, the coordinates of the centroid of the polygon may be recalculated. After recalculation, an adapted region of interest 702 as shown in FIG. 11C and comprising the features of the object 125 which the operator is interested in may be provided. The recalculation may use the following equation $$\begin{pmatrix} x_i^* \\ y_i^* \end{pmatrix} = \begin{pmatrix} x_i \\ y_i \end{pmatrix} + \begin{pmatrix} d_x \\ d_y \end{pmatrix} \quad [4]$$

A further embodiment of the adapting sequence uses a digital image correlation for adapting the region of interest ROI, wherein during the digital image correlation (a) before a step of the processing sequence is carried out, a reference image of an area of the object 125 may be obtained, wherein the area of the object 125 includes the region of interest ROI, (b) after the step of the processing sequence has been carried out, a further image of the area of the object 125 may be obtained, wherein the area of the object 125 includes the region of interest ROI, (c) wherein a displacement vector may be obtained for at least some of the pixels or for each pixel of the further image by comparing the reference image with the further image, and (d) the displacement vector may be used for adapting the region of interest ROI. This is explained in more detail with respect to FIGS. 12A to 12D.

As mentioned above, each region of interest ROI, for example the first region of interest ROI1 and the second region of interest ROI2, each may be a polygon having edges. At least two of the edges may be connected to each other at an edge node. Coordinates of the edge nodes may be given by $(x_i, y_i)$. After having generated an image of the first region of interest ROI1 and the second region of interest ROI2, for example in an imaging task as mentioned above, an additional image 700 comprising all regions of interest, for example the first region of interest ROI1 and the second region of interest ROI2, may be generated. A low magnification of the SEM 100 may be used for generating the additional image 700. The additional image 700 may be saved in the database 134 of the monitoring unit 123 as a reference image.

Figure 12A:
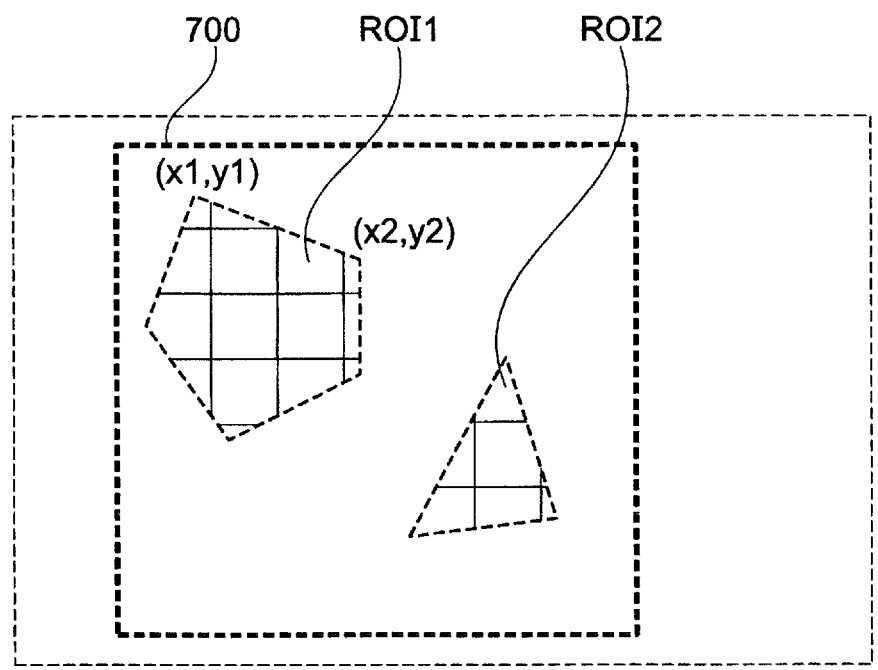
FIG. 12A shows a schematic illustration of a further region of interest to be adapted using a further adapting sequence.
Figure 12B:
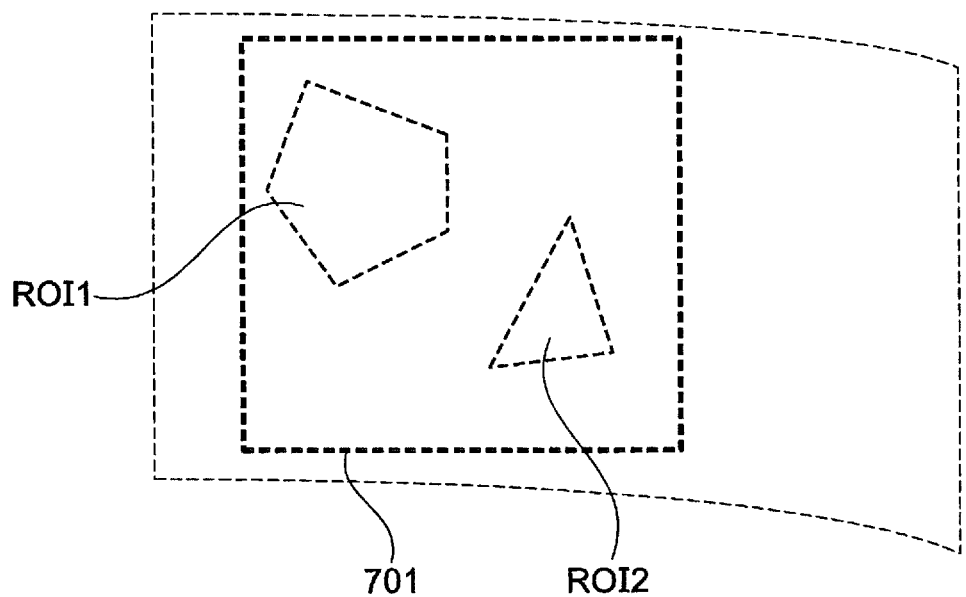
FIG. 12B shows a further schematic illustration of the further region of interest according to FIG. 12A.

After the object 125 has been deformed in one of the steps of the processing sequence, features of the object 125 which the operator is interested in may move from their initial coordinates to further coordinates after the deformation of the object 125. As shown in FIG. 12B, the same area covered by the additional image 700 may be imaged again. Thus, a further additional image 701 of this area may be obtained.

Figure 12C:
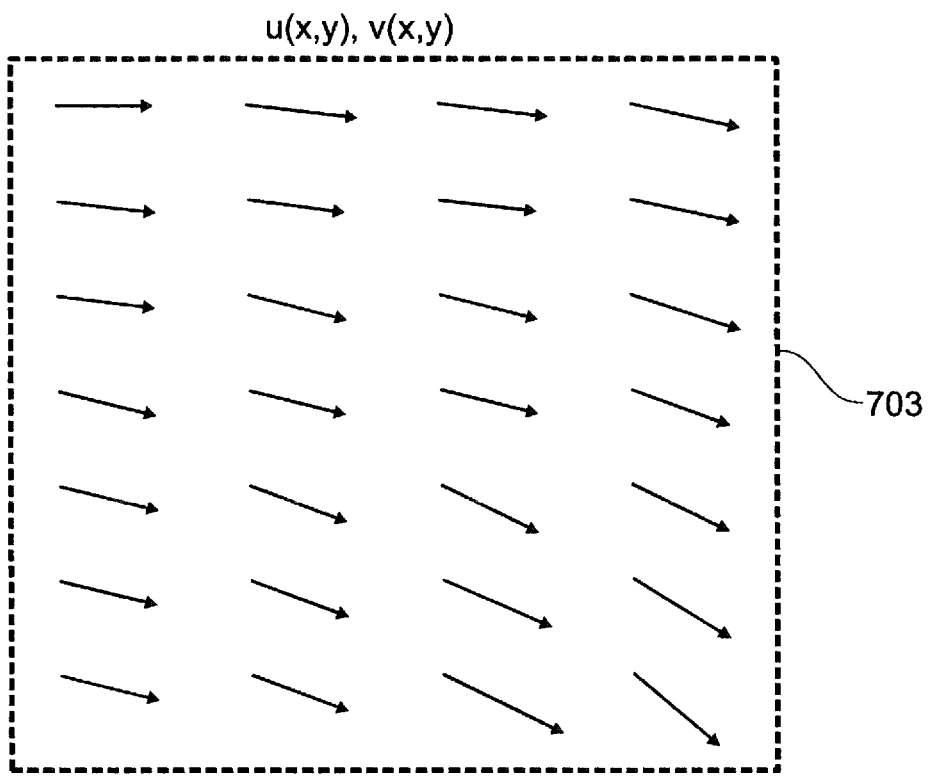
FIG. 12C shows a schematic illustration of a displacement field.

Digital image correlation now may be performed using the additional image 700 and the further additional image 701. As shown in FIG. 12C, the digital image correlation yields a displacement field 703 providing vectors $u(x,y)$ and $v(x,y)$. Vectors $u(x,y)$, and $v(x,y)$ are displacement vectors for at least some of the pixels or for each pixel of the further additional image 702 by comparing the additional image 700 being a reference image with the further additional image 701. The displacement field 703 may be used to recalculate the coordinates of each region of interest after the deformation of the object 125 to obtain an adapted region of interest for each region of interest. The new coordinates of each adapted region of interest may be calculated using the following equation:

$$\begin{pmatrix} x_i^* \\ y_i^* \end{pmatrix} = \begin{pmatrix} x_i \\ y_i \end{pmatrix} + \begin{pmatrix} u(x_i, y_i) \\ v(x_i, y_i) \end{pmatrix} \quad [5]$$

Figure 12D:
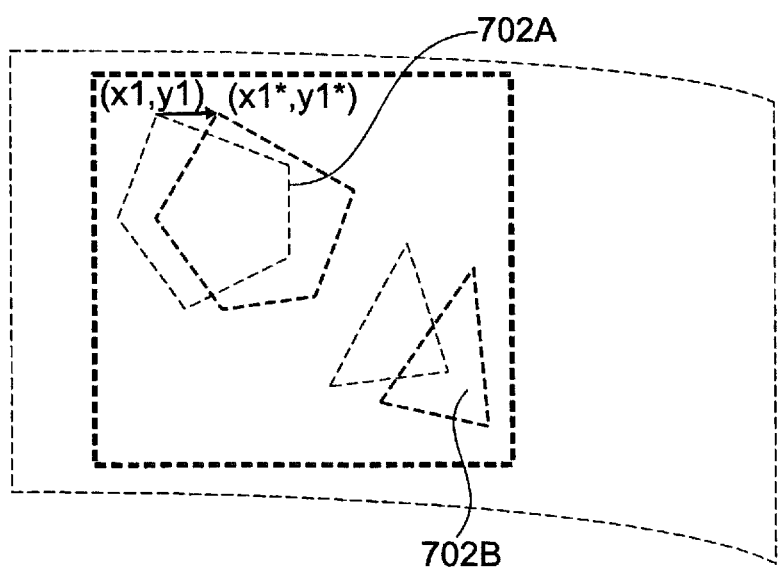
FIG. 12D shows a schematic illustration of the further region of interest according to FIGS. 12A and 12B after being adapted.

When using the above mentioned equation, adapted regions of interest 702A, 702B for each region of interest ROI1, ROI2 are provided as shown in FIG. 12D.

In another embodiment of the method according to the system described herein, the displacement field 703 obtained during the digital image correlation as mentioned above may also be used to automatically define a new region of interest. The displacement field 703 provides for a strain distribution. Therefore, it is possible to automatically find a new region of interest in which strain may be rather concentrated. This new region of interest may be used as the adapted region of interest for the further steps of the method according to the system described herein.

After method step S3 of the method according to FIG. 7 has been carried out, method step S4 provides for automatically processing the object 125 according to the processing sequence defined in method step S3. In other words, processing the object 125 may be carried out without the need of the presence of the operator. As mentioned above, a force may be applied to the object 125, for example, a tensile force, a compressive force, a shearing force, a bending force, and/or torsion force. Moreover, the object 125 may be heated or cooled as mentioned above. After the object 125 has been processed, in particular deformed in one of the steps of the processing sequence, features of the object 125 which the operator is interested in move from their initial coordinates to further coordinates after deformation of the object 125. Therefore, in method step S5, the region of interest, for example at least one of the above mentioned first region of interest ROI1, the second region of interest ROI2, the third region of interest ROI3 and the fourth region of interest ROI4, may be automatically adapted according to the adapting sequence as defined in method step S3. In other words, adapting the aforementioned regions of interest may be carried out without the need of the presence of the operator. In method step S6, the adapted region of interest, for example the adapted first region of interest ROI1, the adapted second region of interest ROI2, the adapted third region of interest ROI3 and the adapted fourth region of interest ROI4 may be automatically imaged and/or analyzed using the SEM 100. In other words, imaging and/or analyzing the object 125 may be carried out without the need of the presence of the operator.

In method step S7, it may be automatically checked whether a terminal condition has been reached, wherein the terminal condition has been defined in method step S3. If the terminal condition has not been reached, method steps S4 to S6 may be repeated. If a terminal condition has been reached, the method according to the system described herein may be stopped in method step S8.

The method according to the system described herein has the advantage that an in-situ experiment, namely an experiment carried out in the object chamber 120 of the SEM 100, in particular an experiment as mentioned above, does not have to be permanently controlled by an operator of the SEM 100. By defining the processing sequence for processing the object 125 by deformation and/or by defining the adapting sequence for adapting at least one of the above mentioned regions of interest depending on the processing sequence (that is according to the processing sequence), the method according to the system described herein may automatically be carried out without permanent control by the operator. Moreover, the method according to the system described herein provides for an optimized workflow for an in-situ experiment carried out in the SEM 100, which workflow may be used for any in-situ experiment.

Various embodiments discussed herein may be combined with each other in appropriate combinations in connection with the system described herein. Additionally, in some instances, the order of steps in the flow diagrams, flowcharts and/or described flow processing may be modified where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that may be stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

The features of the system described herein, in the drawings and in the claims may be essential for the realization of the invention in the various embodiments thereof, both individually and in arbitrary combinations. The invention may not be restricted to the described embodiments. It may be varied within the scope of the claims, taking into account the knowledge of the relevant person skilled in the art. Other embodiments of the invention will be apparent to those skilled in the art from a consideration of the specification and/or an attempt to put into practice the system described herein disclosed herein. It is intended that the specification and examples be considered as illustrative only, with the true scope and spirit of the invention being indicated by the following claims.

The invention claimed is:

1. A method of operating a particle beam device, comprising:
   identifying at least one region of interest on an object;
   defining: (i) an analyzing sequence for analyzing the object, (ii) a processing sequence for processing the object by deformation and (iii) an adapting sequence that modifies the at least one region of interest depending on at least one of: the processing sequence and on the analyzing sequence;
   at least one of: processing the object by deformation according to the processing sequence and analyzing the object according to the analyzing sequence;
   modifying the at least one region of interest according to the adapting sequence; and
   after or while modifying the at least one region of interest, using a primary particle beam being generated by a particle beam generator of the particle beam device to perform at least one of: imaging the at least one region of interest and analyzing the at least one region of interest.

2. The method according to claim 1, further comprising at least one of the following:
   (i) identifying the at least one region of interest using at least one of: the primary particle beam and a further particle beam;
   (ii) using an optical microscope for identifying the at least one region of interest;
   (iii) using a camera for identifying the at least one region of interest;
   (iv) identifying the at least one region of interest as a polygon; and
   (v) subdividing the at least one region of interest into at least two sub regions of interest.

3. The method according to claim 1, wherein defining the processing sequence includes at least one of:
   (i) applying a first tensile force to the object at a first tensile time and applying a second tensile force to the object at a second tensile time;
   (ii) applying a first compressive force to the object at a first compressive time and applying a second compressive force to the object at a second compressive time;
   (iii) applying a first shearing force to the object at a first shearing time and applying a second shearing force to the object at a second shearing time;
   (iv) applying a first bending force to the object at a first bending time and applying a second bending force to the object at a second bending time;

(v) applying a first torsion force to the object at a first torsion time and applying a second torsion force to the object at a second torsion time; and (vi) applying a first temperature to the object at a first temperature time and applying a second temperature to the object at a second temperature time.

4. The method according to claim 3, wherein:

(i) the at least one region of interest is imaged or analyzed at the first tensile time or at the second tensile time; or (ii) applying of the first tensile force is stopped before the at least one region of interest is imaged or analyzed, wherein after imaging or analyzing the at least one region of interest, the second tensile force is applied to the object at the second tensile time; or (iii) the at least one region of interest is imaged or analyzed at the first compressive time or at the second compressive time; or (iv) applying of the first compressive force is stopped before the at least one region of interest is imaged or analyzed, wherein after imaging or analyzing the at least one region of interest, the second compressive force is applied to the object at the second compressive time; or (v) the at least one region of interest is imaged or analyzed at the first shearing time or at the second shearing time; or (vi) applying of the first shearing force is stopped before the at least one region of interest is imaged or analyzed, wherein after imaging or analyzing the at least one region of interest, the second shearing force is applied to the object at the second shearing time; or (vii) the at least one region of interest is imaged or analyzed at the first bending time or at the second bending time; or (viii) applying of the first bending force is stopped before the at least one region of interest is imaged or analyzed, wherein after imaging or analyzing the at least one region of interest, the second bending force is applied to the object at the second bending time; or (ix) the at least one region of interest is imaged or analyzed at the first torsion time or at the second torsion time; or (x) applying of the first torsion force is stopped before the at least one region of interest is imaged or analyzed, wherein after imaging or analyzing the at least one region of interest, the second torsion force is applied to the object at the second torsion time; or (xi) the at least one region of interest is imaged or analyzed at the first temperature time or at the second temperature time; or (xii) applying of the first temperature is stopped before the at least one region of interest is imaged or analyzed, wherein after imaging or analyzing the at least one region of interest, the second temperature is applied to the object at the second temperature time.

5. The method according to claim 1, wherein:

(i) the at least one region of interest is imaged or analyzed until an elastic limit of the object is reached; or (ii) the at least one region of interest is imaged or analyzed when an elastic limit of the object is reached; or (iii) the at least one region of interest is imaged or analyzed when an elastic limit of the object is exceeded; or (iv) the at least one region of interest is imaged or analyzed until a tensile strength limit of the object is reached; or (v) the at least one region of interest is imaged or analyzed when a tensile strength limit of the object is reached.

6. The method according to claim 1, wherein defining the adapting sequence includes at least one of the following:

(i) using a cross correlation to modify the at least one region of interest, wherein while performing the cross correlation (a) before a step of the analyzing sequence or of the processing sequence is carried out, a first image of the at least one region of interest is obtained first, (b) after the step of the analyzing sequence or of the processing sequence has been carried out, a second image of the at least one region of interest is obtained second, (c) a shift between the first image and the second image of the at least one region of interest is calculated using a calculation unit, and wherein (d) the shift is used to modify the at least one region of interest; and (ii) using a digital image correlation to modify the at least one region of interest, wherein while performing the digital image correlation (a) before a step of the analyzing sequence or of the processing sequence is carried out, a reference image of an area of the object is obtained, wherein the area of the object includes the at least one region of interest, (b) after the step of the analyzing sequence or of the processing sequence has been carried out, a processing image of the area of the object is obtained, wherein the area of the object includes the at least one region of interest, (c) obtaining a displacement vector for at least some of the pixels or for each pixel of the processing image by comparing the reference image with the processing image, and (d) using the displacement vector to modify the at least one region of interest.

7. The method according to claim 1, further comprising:

(i) providing a stop signal; and (ii) after the stop signal has been provided, stopping automatic processing of the object or automatic modification of the at least one region of interest or automatic imaging of the at least one region of interest or automatic analysis of the at least one region of interest.

8. The method according to claim 7, wherein:

(i) the stop signal is provided by a user of the particle beam device; or (ii) the stop signal is provided if an end of the processing sequence has been reached; or (iii) the stop signal is provided if a specific condition of the object has been reached during the processing.

9. The method according to claim 1, wherein the at least one region of interest is a first region of interest and wherein the method further comprises:

(i) identifying a second region of interest on the object; and (ii) using the second region of interest.

10. The method according to claim 1, wherein:

(i) processing the object comprises automatically processing the object by deformation according to the processing sequence; or (ii) analyzing the object comprises automatically analyzing the object according to the analyzing sequence; or (iii) modifying the at least one region of interest comprises automatically modifying the at least one region of interest according to the adapting sequence; or (iv) after or while modifying the at least one region of interest, imaging or analyzing the at least one region of interest comprises automatically imaging or automatically analyzing the at least one region of interest using the primary particle beam being generated by a particle beam generator of the particle beam device.

11. Computer program product comprising a program code which is loaded into a processor and which, when being executed, controls a particle beam device to carry out a method comprising:
  identifying at least one region of interest on an object;
  defining: (i) an analyzing sequence for analyzing the object, (ii) a processing sequence for processing the object by deformation and (iii) an adapting sequence that modifies the at least one region of interest depending on the processing sequence or on the analyzing sequence;
  processing the object by deformation according to the processing sequence or analyzing the object according to the analyzing sequence;
  modifying the at least one region of interest according to the adapting sequence; and
  after or while modifying the at least one region of interest, imaging or analyzing the at least one region of interest using a primary particle beam being generated by a particle beam generator of the particle beam device.

12. The computer program product according to claim 11, wherein the method further comprises at least one of the following:
  using the primary particle beam or a further particle beam for identifying the at least one region of interest;
  using an optical microscope for identifying the at least one region of interest;
  using a camera for identifying the at least one region of interest;
  identifying the at least one region of interest as a polygon; and
  subdividing the at least one region of interest into at least two sub regions of interest.

13. The computer program product according to claim 11, wherein defining the processing sequence includes at least one of the following:
  applying a first tensile force to the object at a first tensile time and applying a second tensile force to the object at a second tensile time;
  applying a first compressive force to the object at a first compressive time and applying a second compressive force to the object at a second compressive time;
  applying a first shearing force to the object at a first shearing time and applying a second shearing force to the object at a second shearing time;
  applying a first bending force to the object at a first bending time and applying a second bending force to the object at a second bending time;
  applying a first torsion force to the object at a first torsion time and applying a second torsion force to the object at a second torsion time; and
  applying a first temperature to the object at a first temperature time and applying a second temperature to the object at a second temperature time.

14. The computer program product according to claim 11, wherein:
  the at least one region of interest is imaged or analyzed until an elastic limit of the object is reached; or
  the at least one region of interest is imaged or analyzed when an elastic limit of the object is reached; or
  the at least one region of interest is imaged or analyzed when an elastic limit of the object is exceeded; or
  the at least one region of interest is imaged or analyzed until a tensile strength limit of the object is reached; or
  the at least one region of interest is imaged or analyzed when a tensile strength limit of the object is reached.

15. The computer program product according to claim 11, wherein defining the adapting sequence includes at least one of the following:
  using a cross correlation to modify the at least one region of interest, wherein while performing the cross correlation (a) before a step of the analyzing sequence or of the processing sequence is carried out, a first image of the at least one region of interest is obtained first, (b) after the step of the analyzing sequence or of the processing sequence has been carried out, a second image of the at least one region of interest is obtained second, (c) a shift between the first image and the second image of the at least one region of interest is calculated using a calculation unit, and wherein (d) the shift is used to modify the at least one region of interest; and
  using a digital image correlation to modify the at least one region of interest, wherein while performing the digital image correlation (a) before a step of the analyzing sequence or of the processing sequence is carried out, a reference image of an area of the object is obtained, wherein the area of the object includes the at least one region of interest, (b) after the step of the analyzing sequence or of the processing sequence has been carried out, a processing image of the area of the object is obtained, wherein the area of the object includes the at least one region of interest, (c) obtaining a displacement vector for at least some of the pixels or for each pixel of the processing image by comparing the reference image with the processing image, and (d) using the displacement vector to modify the at least one region of interest.

16. The computer program product according to claim 11, wherein the method further comprises:
  providing a stop signal; and
  after the stop signal has been provided, stopping automatic processing of the object or automatic modification of the at least one region of interest or automatic imaging of the at least one region of interest or automatic analysis of the at least one region of interest.

17. A particle beam device, comprising:
  at least one particle beam generator for generating a primary particle beam having charged particles;
  at least one objective lens for focusing the primary particle beam onto an object;
  at least one detector for detecting interaction particles or interaction radiation, the interaction particles and the interaction radiation being generated when the primary particle beam impinges on the object;
  at least one processing unit for processing the object by deformation; and
  a processor into which a computer program product comprising computer program code is loaded, and which program code, when being executed, controls a particle beam device to carry out a method including:
    identifying at least one region of interest on the object;
    defining: (i) an analyzing sequence for analyzing the object, (ii) a processing sequence for processing the object by deformation and (iii) an adapting sequence that modifies the at least one region of interest depending on the processing sequence or on the analyzing sequence;
    processing the object by deformation according to the processing sequence or analyzing the object according to the analyzing sequence;

modifying the at least one region of interest according to the adapting sequence; and after or while modifying the at least one region of interest, imaging or analyzing the at least one region of interest using a primary particle beam being generated by a particle beam generator of the particle beam device.

18. The particle beam device according to claim 17, wherein the processing unit is a deformation unit.

19. The particle beam device according to claim 17, wherein the particle beam generator is a first particle beam generator for generating a first primary particle beam having first charged particles, wherein the objective lens is a first objective lens for focusing the first primary particle beam onto the object, and wherein the particle beam device further comprises: a second particle beam generator for generating a second primary particle beam having second charged particles and a second objective lens for focusing the second primary particle beam onto the object.

20. The particle beam device according to claim 17, wherein the particle beam device is at least one of the following: an electron beam device and an ion beam device.

* * * * *